(12) United States Patent
Yu et al.

(10) Patent No.: US 11,728,439 B2
(45) Date of Patent: Aug. 15, 2023

(54) MERGED PIN SCHOTTKY (MPS) DIODE WITH PLASMA SPREADING LAYER AND MANUFACTURING METHOD THEREOF

(71) Applicants: Xiaotian Yu, Los Angeles, CA (US); Zheng Zuo, Los Angeles, CA (US); Ruigang Li, Los Angeles, CA (US)

(72) Inventors: Xiaotian Yu, Los Angeles, CA (US); Zheng Zuo, Los Angeles, CA (US); Ruigang Li, Los Angeles, CA (US)

( * ) Notice: Subject to any disclaimer, the term of this patent is extended or adjusted under 35 U.S.C. 154(b) by 0 days.

(21) Appl. No.: 17/235,896

(22) Filed: Apr. 20, 2021

(65) Prior Publication Data
US 2021/0328076 A1 Oct. 21, 2021

Related U.S. Application Data

(60) Provisional application No. 63/012,896, filed on Apr. 20, 2020.

(51) Int. Cl.
| | |
|---|---|
| *H01L 29/66* | (2006.01) |
| *H01L 29/868* | (2006.01) |
| *H01L 29/16* | (2006.01) |
| *H01L 29/872* | (2006.01) |

(52) U.S. Cl.
CPC ........ *H01L 29/868* (2013.01); *H01L 29/1608* (2013.01); *H01L 29/66121* (2013.01); *H01L 29/66143* (2013.01); *H01L 29/872* (2013.01)

(58) Field of Classification Search
CPC combination set(s) only.
See application file for complete search history.

(56) References Cited

U.S. PATENT DOCUMENTS

| | | | |
|---|---|---|---|
| 2009/0160008 A1* | 6/2009 | Fujiwara | H01L 29/872 257/E21.477 |
| 2015/0270354 A1* | 9/2015 | Shimizu | H01L 21/265 257/77 |

\* cited by examiner

*Primary Examiner* — Moin M Rahman
(74) *Attorney, Agent, or Firm* — Che-Yang Chen; Law Office of Michael Chen

(57) ABSTRACT

A method for manufacturing a merged PiN Schottky (MPS) diode may include steps of providing a substrate having a first conductivity type; forming an epitaxial layer with the first conductivity type on top of the substrate; forming a plurality of regions with a second conductivity type under a top surface of the epitaxial layer; forming a plasma spreading layer; depositing and patterning a first Ohmic contact metal on the regions with the second conductivity type; depositing a Schottky contact metal on top of the entire epitaxial layer; and forming a second Ohmic contact metal on a backside of the substrate. In another embodiment, the step of forming a plurality of regions with a second conductivity type may include steps of depositing and patterning a mask layer on the epitaxial layer, implanting P-type dopant into the epitaxial layer, and removing the mask layer.

4 Claims, 43 Drawing Sheets

MERGED PIN SCHOTTKY (MPS) DIODE WITH PLASMA SPREADING LAYER AND MANUFACTURING METHOD THEREOF

CROSS-REFERENCE TO RELATED APPLICATIONS

This application claims priority under 35 U.S.C. § 119 (e) to U.S. Provisional Patent Application Ser. No. 63/012,896, filed on Apr. 20, 2020, the entire contents of which are hereby incorporated by reference.

FIELD OF THE INVENTION

The present invention relates to a power diode structure, and more particularly to a merged PiN junction Schottky (MPS) diode with enhanced reliability under a surge current.

BACKGROUND OF THE INVENTION

Power devices include power diodes and power switching transistors. Power diodes have two modes of operation in circuit applications, which are conduction mode and blocking mode. For the conduction mode, in addition to nominal current conditions, there is an occasional surge current condition. Under the abnormal conditions with surge current, the diode may have instant energy overshoot and chip temperature rise, resulting in device failure.

Power devices are expected to endure high current stresses under surges caused by circuit failure or lightening. Usually a great amount of energy, caused by high current multiplied by high voltage drop, flows into the device in quite a short time, leading to rapidly raised temperature and possibly a device failure. Surge capability is a key performance index which describes the robustness of power devices under extreme operating conditions. Devices with preeminent surge capability can dissipate such energy efficiently without a failure, thus offering a higher safety margin to the power system.

Silicon carbide semiconductor has two times larger bandgap compared with Silicon semiconductor. With a higher critical electric field, higher thermal conductivity, lower intrinsic carrier concentration, and higher saturation drift velocity, silicon carbide semiconductor has become an ideal candidate for high voltage, high temperature and high-power devices.

There are two technical routes for commercial devices based on silicon carbide power diodes, namely junction barrier Schottky (JBS) diode structure and merged PiN Schottky (MPS) diode structure.

For silicon carbide (SiC) materials, the Junction Barrier Schottky (JBS) diode is widely used. Armed with excellent characteristics of SiC material and characterized by alternatively arranged small P+ regions in N- drift layer, it has received large attention for its low forward voltage drop and low reverse leakage current. Merged PiN Schottky (MPS) diode was proposed based on the JBS diode structure, with merged large P+ regions into the active region. PN junctions formed by these large P+ regions will turn on under high current flows. Large amount of minority carriers will be injected into the drift layer, providing a lower resistivity and a higher current conduction capability. Thus, it offers higher surge capability compared to traditional JBS diode, as well as preserving a low forward voltage drop and reverse leakage current at the same time.

SUMMARY OF THE INVENTION

In one aspect, a merged PiN Schottky (MPS) diode may include a silicon carbide substrate having a first conductivity type, an epitaxial layer with the first conductivity type formed on the substrate, In one embodiment, the doping concentration in the epitaxial layer is lower than that in the substrate. The merged PiN Schottky (MPS) diode may further include a plurality of regions having a second conductivity type different from the first conductivity type, and formed under a top surface of the epitaxial layer.

A first Ohmic contact metal is formed on top of each of the regions of the second conductivity type, and a Schottky contact metal is placed on top of the entire epitaxial layer to form a Schottky junction. A second Ohmic contact is formed by a cathode electrode on the back side of the substrate.

In one embodiment, the first conductivity is N type, and the second conductivity type is P type. It is noted that in the merged PiN Schottky (MPS) diode structure, a PN junction can be formed by a P+ region, and a N-type drift region can be turned on under surge current condition, forming a parallel operation mode between the PN junction and the Schottky junction, providing device with better surge current capability.

In a merged PiN Schottky (MPS) diode structure, the PN junction formed by the P+ region and the N-type drift region can be turned on under surge current condition, forming a parallel operation mode between the PN junction and the Schottky junction, providing device with better surge current capability. The shape, size and arrangement of the P+ region largely affect the electrical characteristics of the merged PiN Schottky (MPS) diode in the event of a high current surge.

In one embodiment, the merged PiN Schottky (MPS) diode may have two hexagonal cells, the central hexagonal P+ island and the hexagonal P+ outer ring isolated from each other. Under surge current condition, the PN junctions formed between the P+ regions and the N-type drift region will be turned on. Due to the bipolar effect, minority carriers are injected on both sides of the PN junction to form electron-hole plasmas. These plasmas are first generated under the PN junction. At the moment of the surge current occurs, it is difficult for these plasmas to rapidly spread to other part of the devices, same for the surge current and the heat generated inside the device. As a result, a localized heating phenomenon that causes the device to fail prematurely is inevitable.

Based on the problem described above, this patent proceeds from the structural design of the device, connecting the P+ regions through the structure of the plasma spreading layer. Once the surge current occurs, the plasma spreading layer can help rapidly diffusing the plasma to other drift regions, resulting in the surge current and the heat generated inside the device evenly dispersed over the device to avoid localized heating.

In another aspect, a method for manufacturing a merged PiN Schottky (MPS) diode may include steps of providing a substrate having a first conductivity type; forming an epitaxial layer with the first conductivity type on top of the substrate; forming a plurality of regions with a second conductivity type under a top surface of the epitaxial layer; forming a plasma spreading layer in each region; depositing and patterning an Ohmic contact metal on the regions with the second conductivity type; depositing a Schottky contact metal on top of the entire epitaxial layer; and forming an Ohmic contact metal on a backside of the substrate.

In one embodiment, the epitaxial layer is made of N-type silicon carbide. In another embodiment, the step of forming a plurality of regions with a second conductivity type under a top surface of the epitaxial layer may include steps of depositing and patterning a mask layer on the epitaxial layer, implanting P-type dopant into the epitaxial layer, and removing the mask layer. It is noted that the dopant can be aluminum or boron.

In a further embodiment, the step of depositing and patterning an Ohmic contact metal on the regions may include a step of annealing the Ohmic metal to enable the metal to be in direct contact with the epitaxial layer. In still a further embodiment, the step of depositing a Schottky contact metal on top of the entire epitaxial layer may include a step of conducting a low temperature annealing of the Schottky contact metal.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
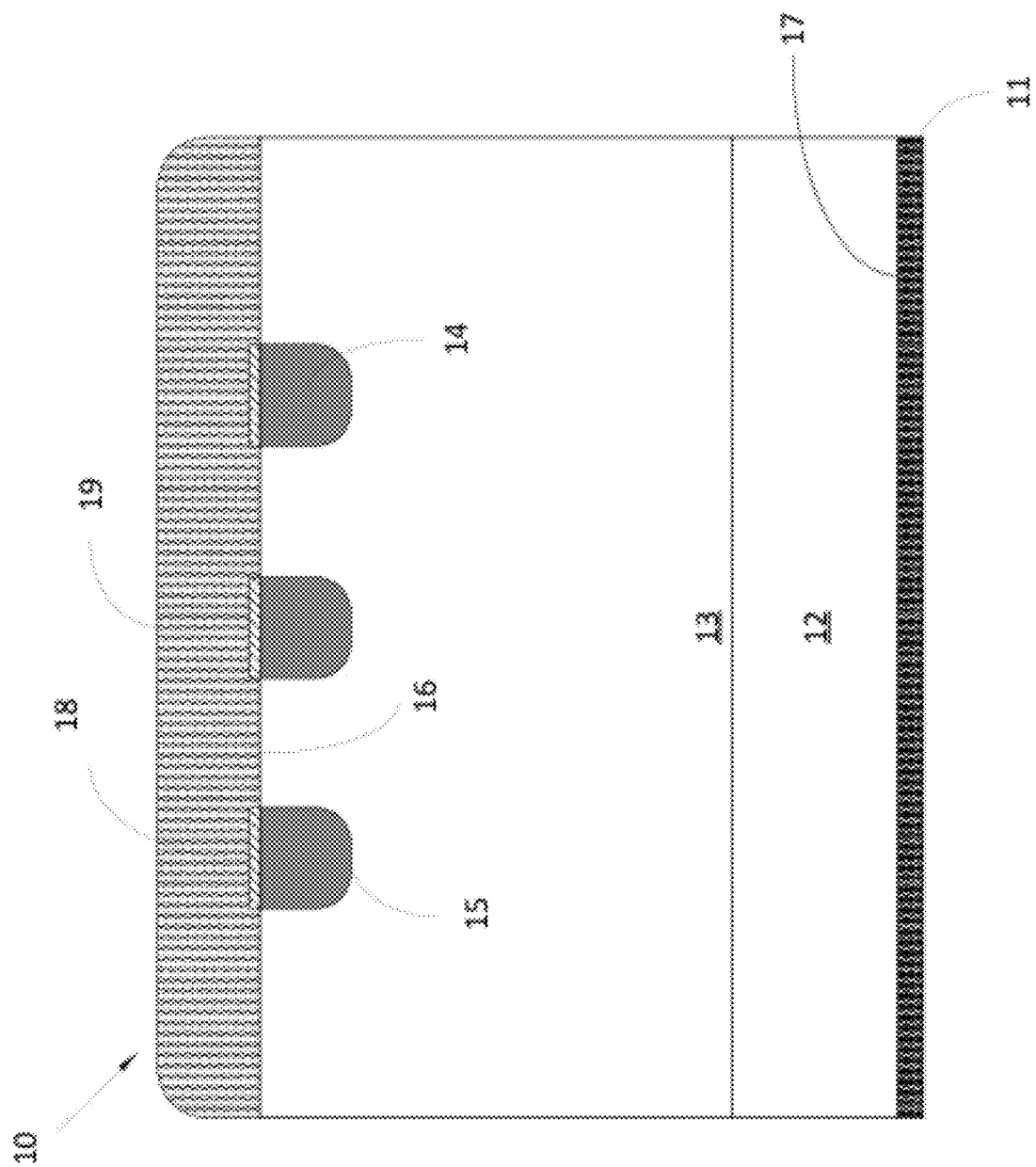
FIG. 1 is a cross-section view of the merged PiN Schottky (MPS) diode in the present invention.

In one aspect as shown in FIG. 1, a merged PiN Schottky (MPS) diode 10 may include a silicon carbide substrate 12 having a first conductivity type, an epitaxial layer 13 with the first conductivity type formed on the substrate 12. In one embodiment, the doping concentration in the epitaxial layer 13 is lower than that in the substrate 12. The merged PiN Schottky (MPS) diode 10 may further include a plurality of regions 14 having a second conductivity type different from the first conductivity type, and formed on the surface of the epitaxial layer 13.

A first Ohmic contact metal 18 is formed on top of each of the regions of the second conductivity type, and a Schottky contact metal 19 is placed on top of the entire epitaxial layer 13 to form a Schottky junction 16. A second Ohmic contact 17 is formed by a cathode electrode 11 on the back side of the substrate 12.

In one embodiment, the first conductivity is N type, and the second conductivity type is P type. It is noted that in the merged PiN Schottky (MPS) diode structure, a PN junction can be formed by a P+ region 14, and a N-type drift region 15 can be turned on under surge current condition, forming a parallel operation mode between the PN junction and the Schottky junction 16, providing device with better surge current capability.

It is noted that the layout design of the merged PiN Schottky (MPS) diode 10 can be strip cell structure, circle cell structure or polygon cell structure. The one-dimensional strip structure has the drawback that the P+ region occupies too much active area, resulting in insufficient Schottky area for normal current operation, leading to a large forward voltage drop of the device. However, two-dimensional circles will also lead to a large P+ percentage because circular cells cannot form a close-packed layout. Therefore, compared with regular polygon cell structure, the device will also have larger forward voltage drop due to inadequate Schottky area under normal current operation.

Figure 2:
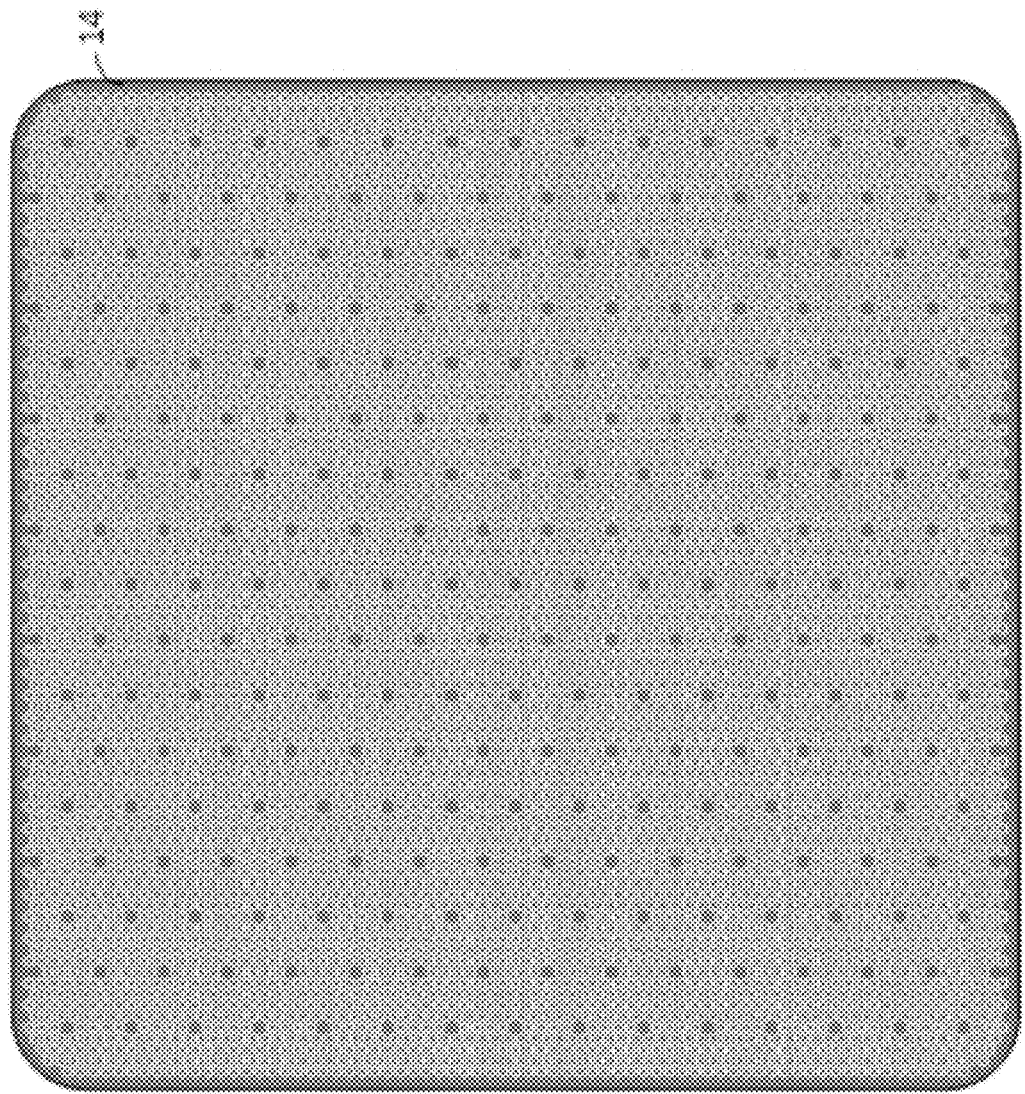
FIG. 2 is a schematic view of a layout design of a merged PiN Schottky (MPS) diode with two types of hexagonal cells.
Figure 3:
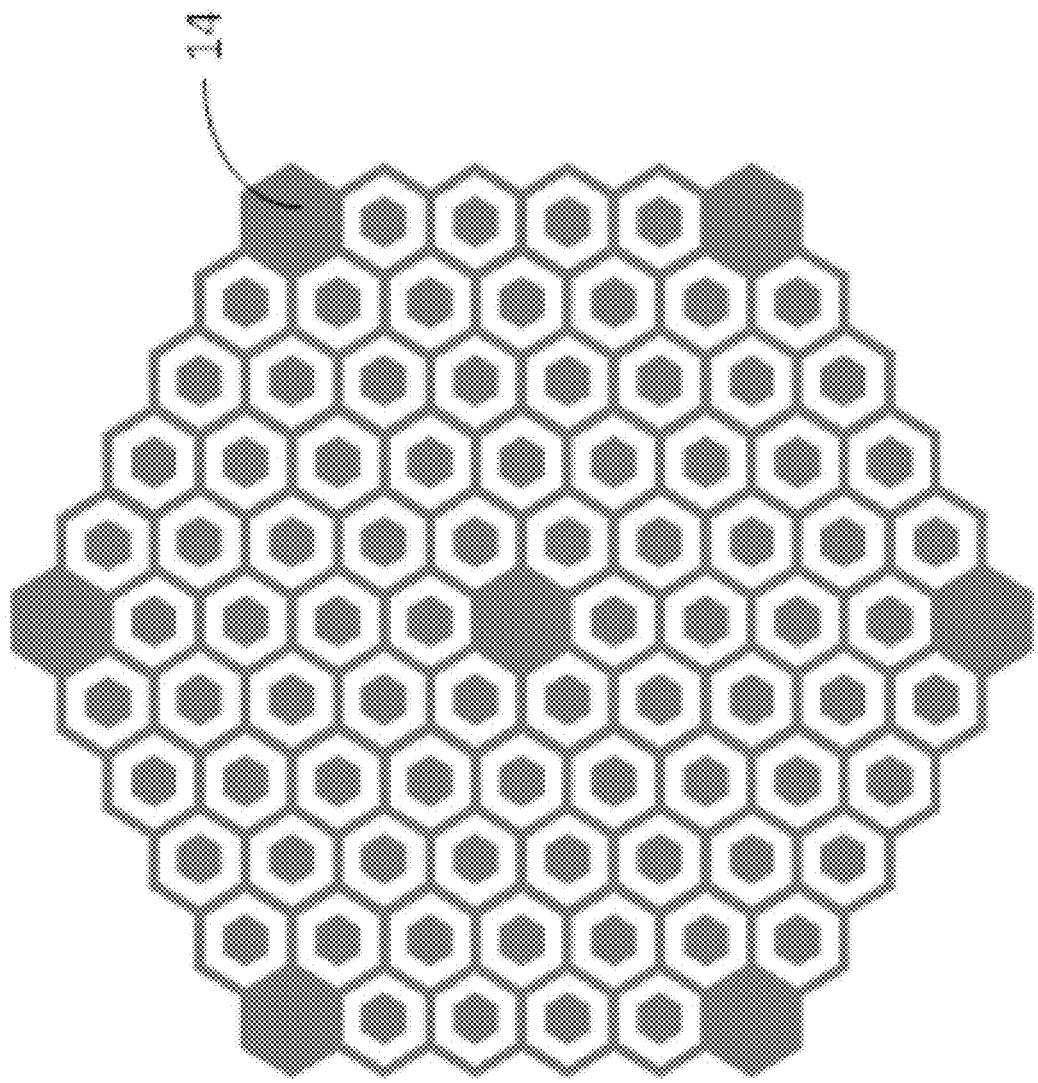
FIG. 3 is a schematic view of a merged PiN Schottky (MPS) diode with a third type hexagonal cells combining the first and second types of hexagonal cells.

Referring to FIG. 2, in one embodiment, a merged PiN Schottky (MPS) diode may have a first type of hexagonal cell (island with ring) and a second type of hexagonal cell (island); and the first type and second type hexagonal cells can be arranged to form a third type hexagonal cell including repetitive units as shown in FIG. 3.

Figure 4:
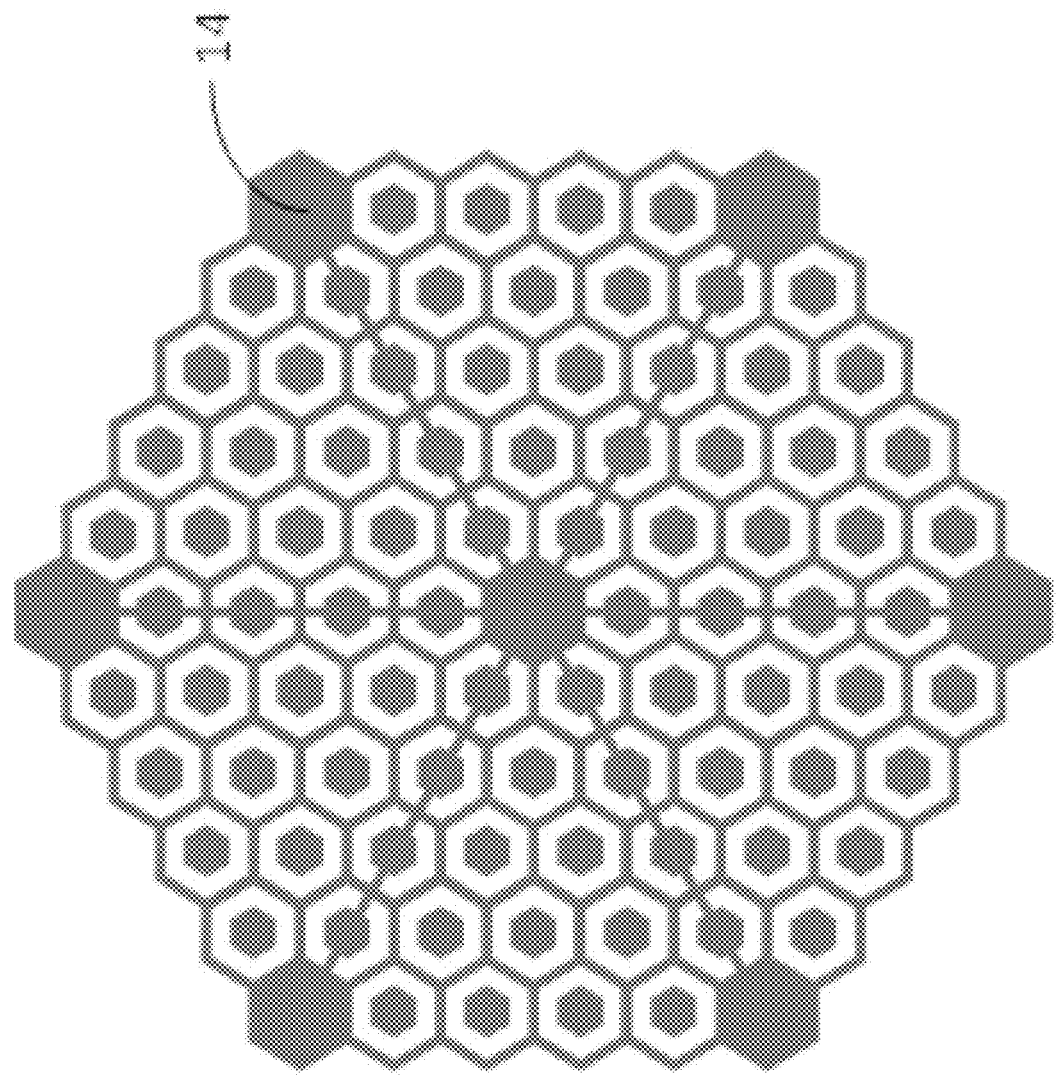
FIG. 4 is a schematic view of the merged PiN Schottky (MPS) diode with a fourth type hexagonal cell having a plasma spreading layer.
Figure 5:
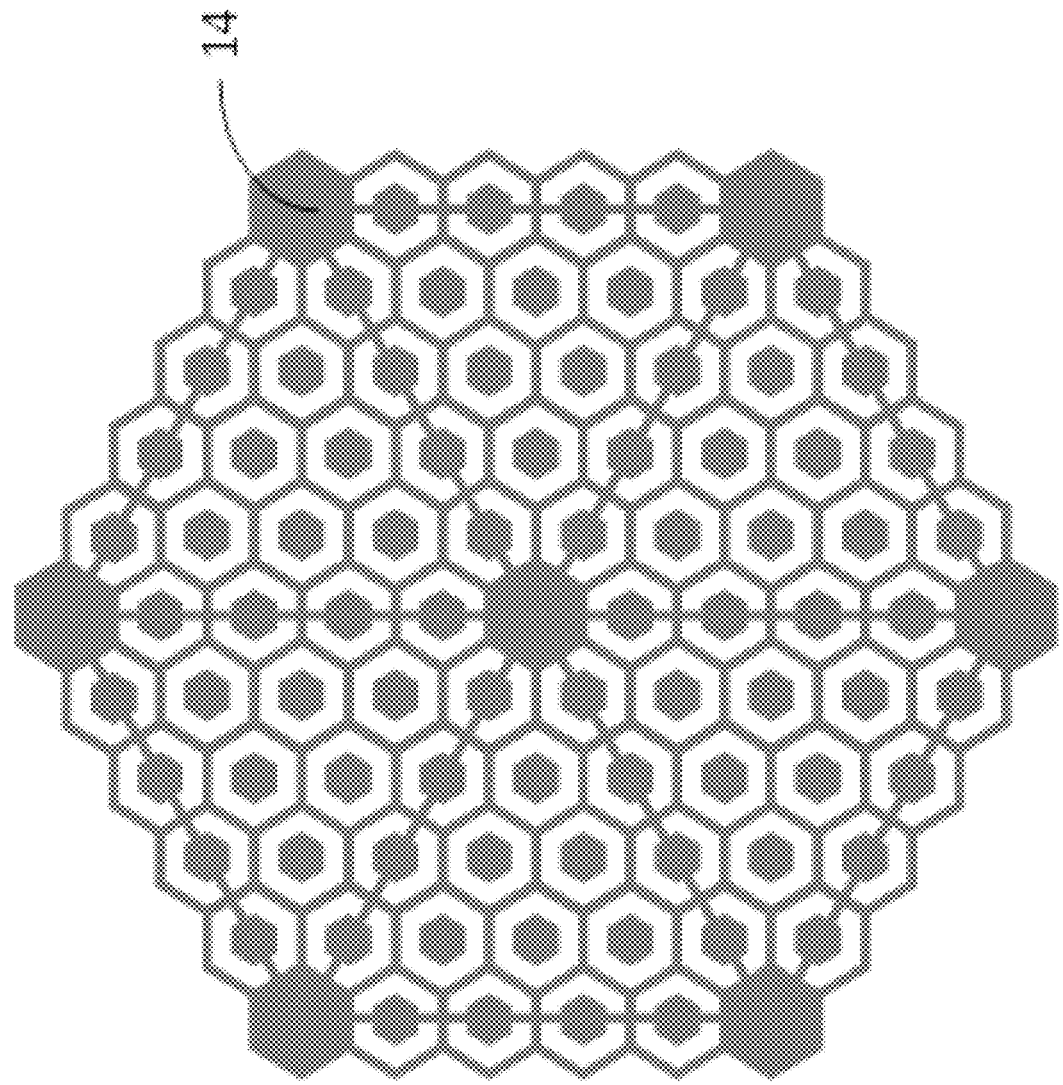
FIG. 5 is a schematic view of the merged PiN Schottky (MPS) diode with a fourth type hexagonal cell having a different plasma spreading layer.
Figure 6:
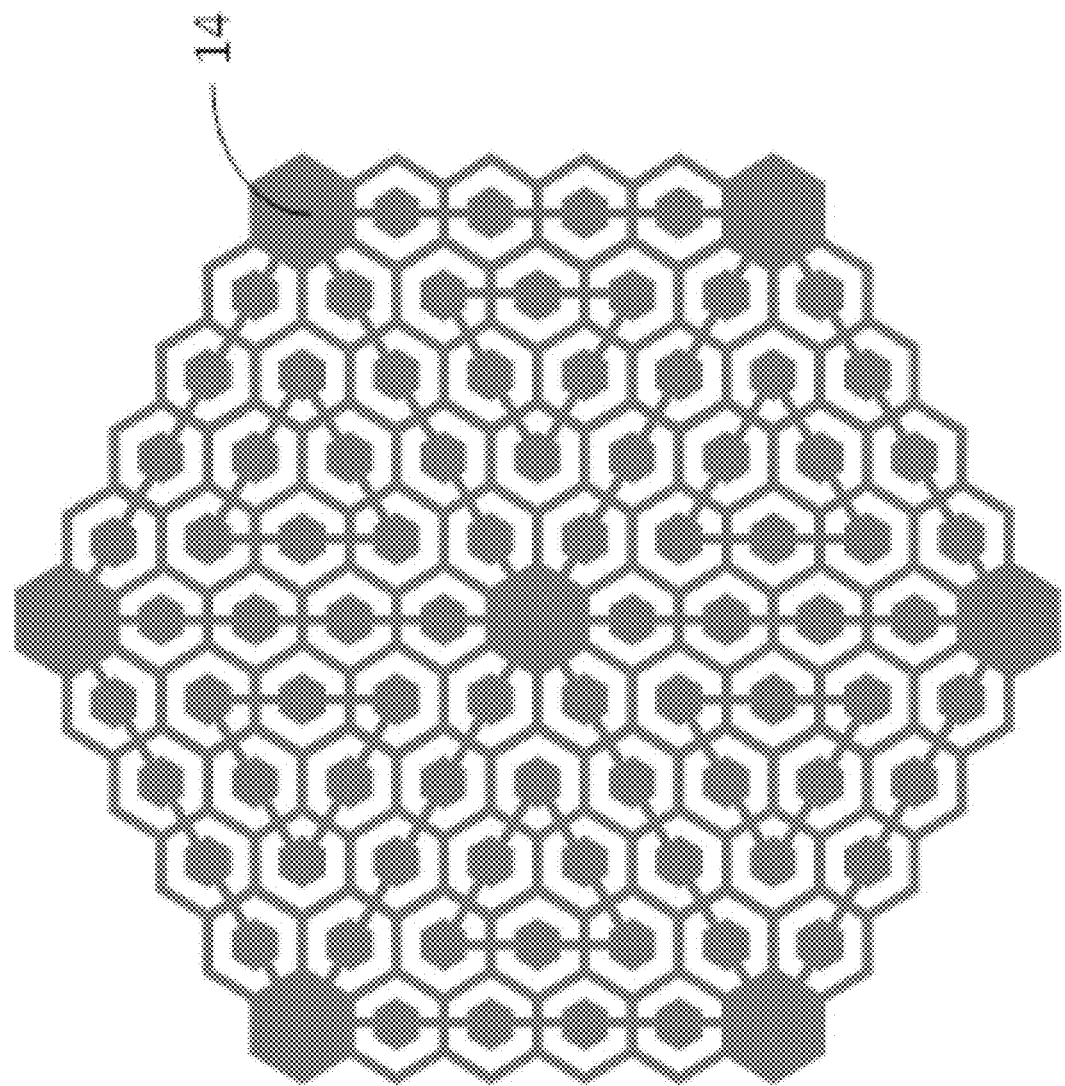
FIGS. 6, 6B, 6C and 6D illustrate schematic views of the merged PiN Schottky (MPS) diode with a fourth type hexagonal cell having triangular-based plasma spreading layers.
Figure 6B:
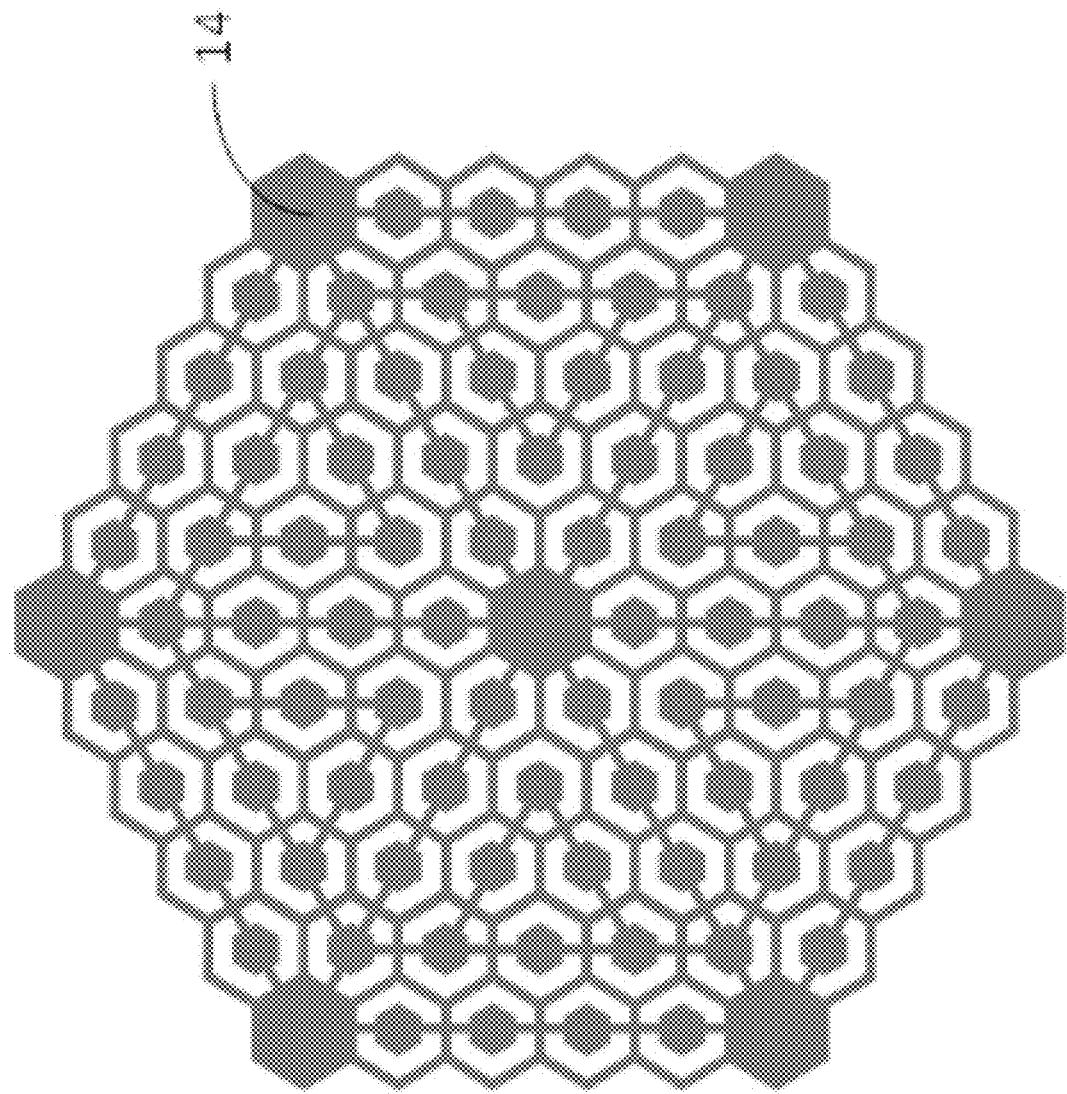
Figure 6C:
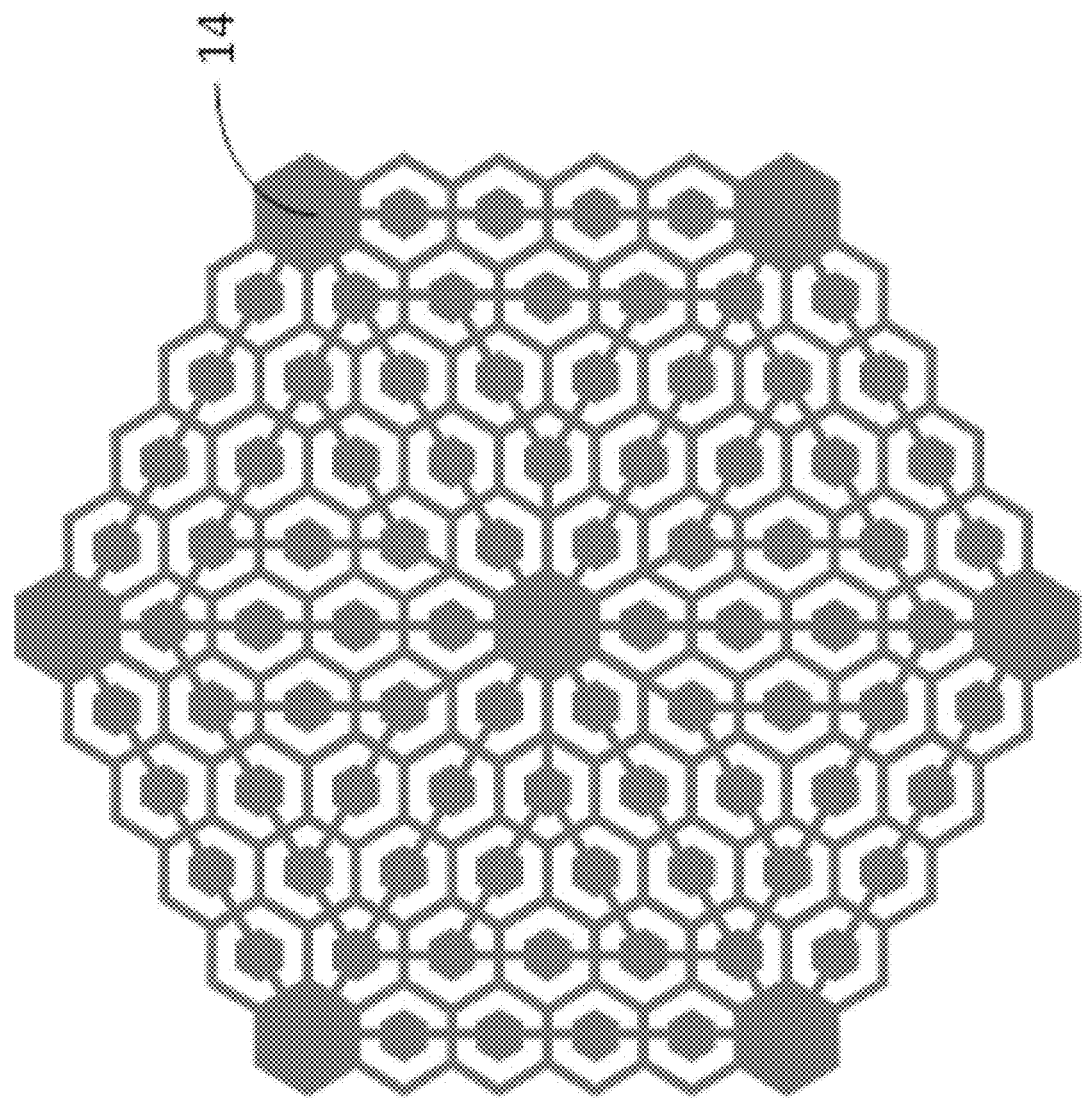
Figure 6D:
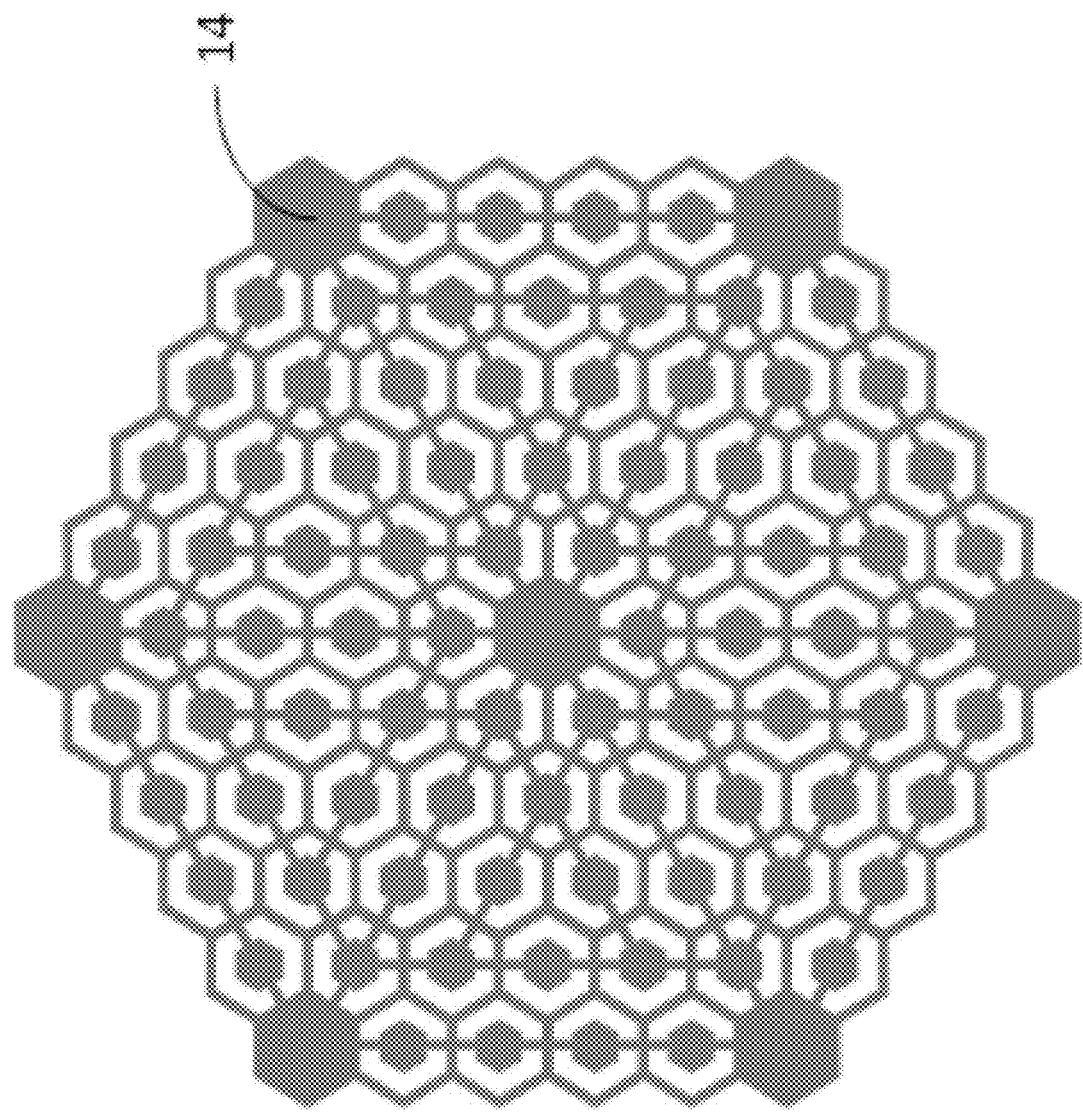

In another embodiment, FIGS. 4 to 7 illustrate different plasma spreading layer designs on the third type hexagonal cell. As a result, the high surge current and dissipated energy can be evenly distributed within the third type hexagonal unit with the plasma spreading layer to effectively prevent localized heating. Here, the hexagonal cell with plasma spreading layer in FIG. 4 is called a fourth type hexagonal cell.

Figure 7A:
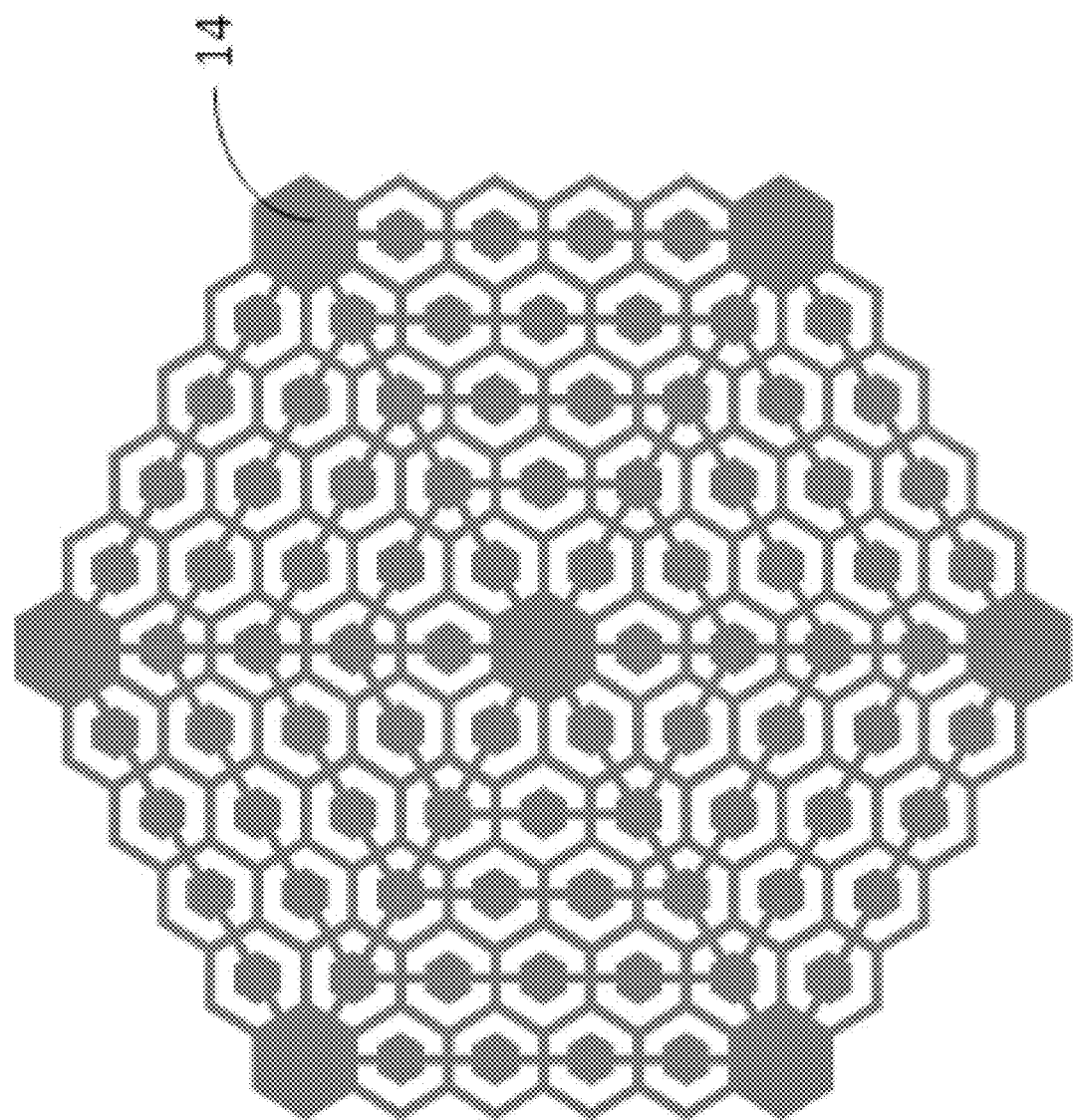
FIGS. 7A and 7B illustrate schematic views of the merged PiN Schottky (MPS) diode with a fourth type hexagonal cell having hexagonal-based plasma spreading layers.
Figure 7B:
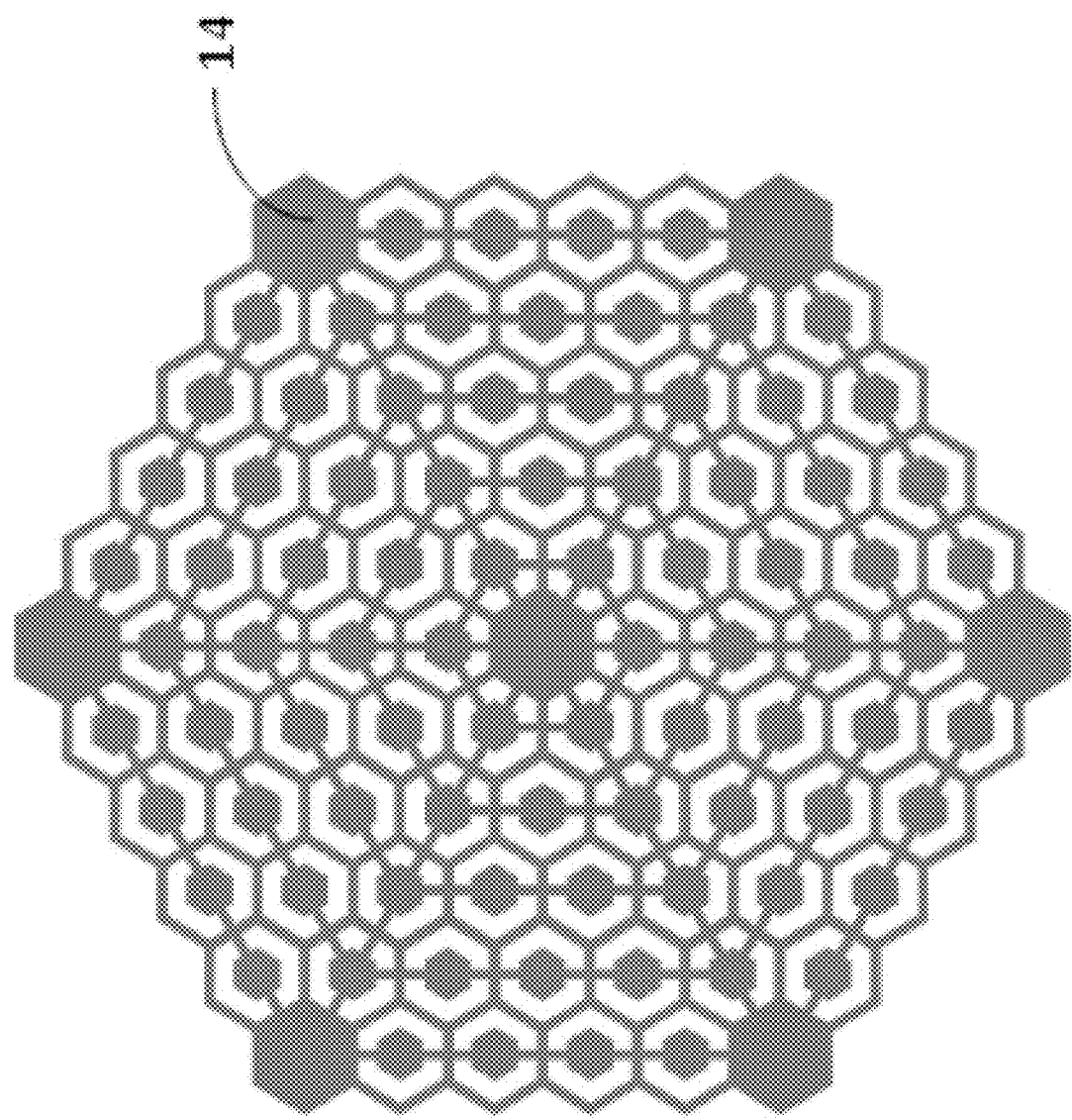

In a further embodiment, based on the design in FIGS. 5, 6, 6B, 6C and 6D add different types of triangular-based plasma spreading layers to connect isolated P+ islands, while FIGS. 7A and 7B show the layout designs by adding hexagonal-based plasma spreading structure to connect isolated P+ islands.

Figure 8:
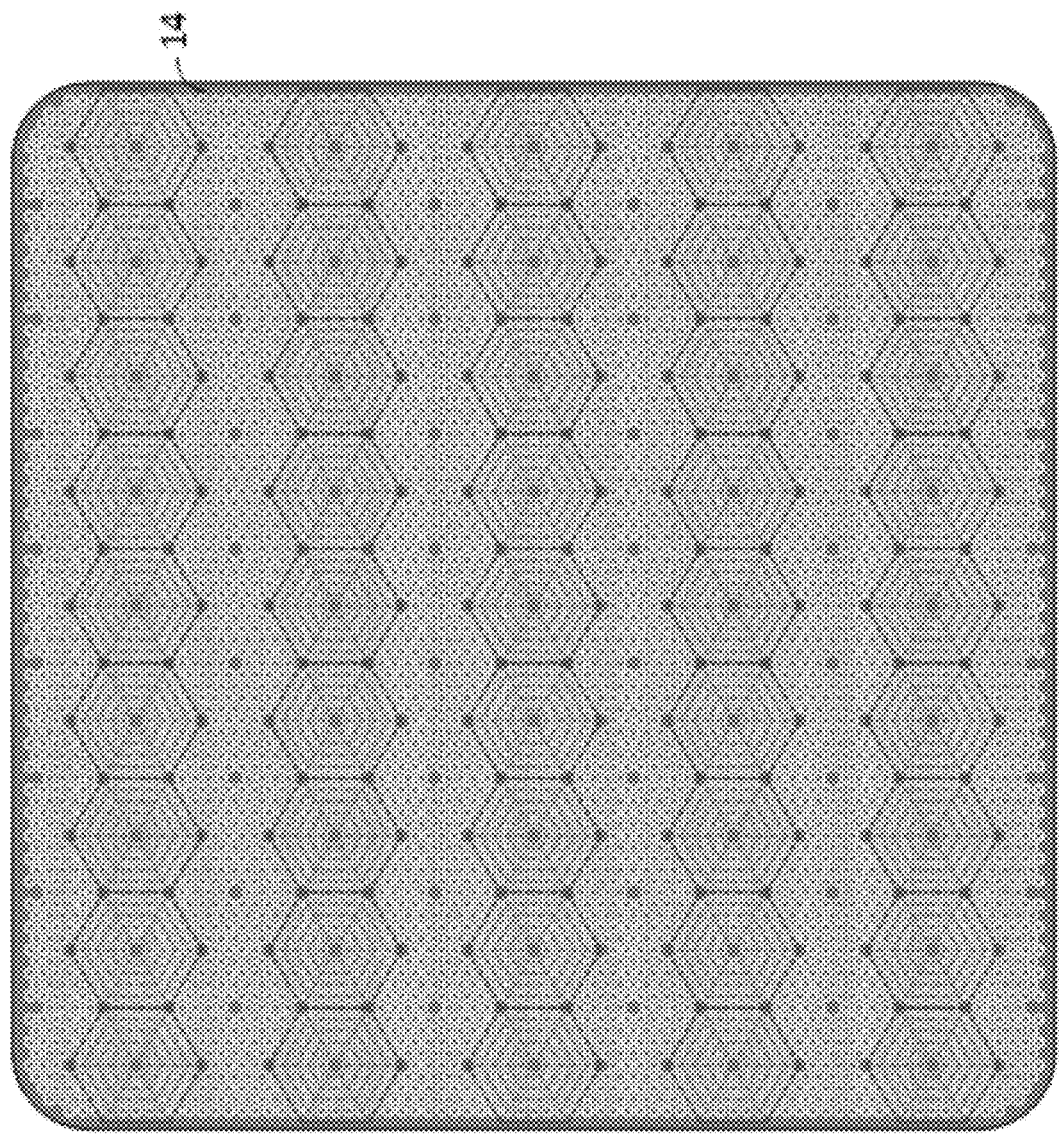
FIG. 8 is a schematic view of the merged PiN Schottky (MPS) diode with a first linear arrangement of the hexagonal cells, wherein there is one layer of the third type hexagonal cell between the adjacent layer of the fourth type hexagonal cell.

In still a further embodiment, FIG. 8 shows a first linear arrangement, the sides of the adjacent fourth type hexagonal cell (highlighted with red line) are connected to each other. During the surge current shock, the PN junction formed by the large P+ hexagon 14 and N-type drift layer is first turned on, then the bipolar effect takes place and the electron-holes are created. With the plasma spreading layer, the electron-hole plasma can be dispersed to the whole area of the device.

Figure 9:
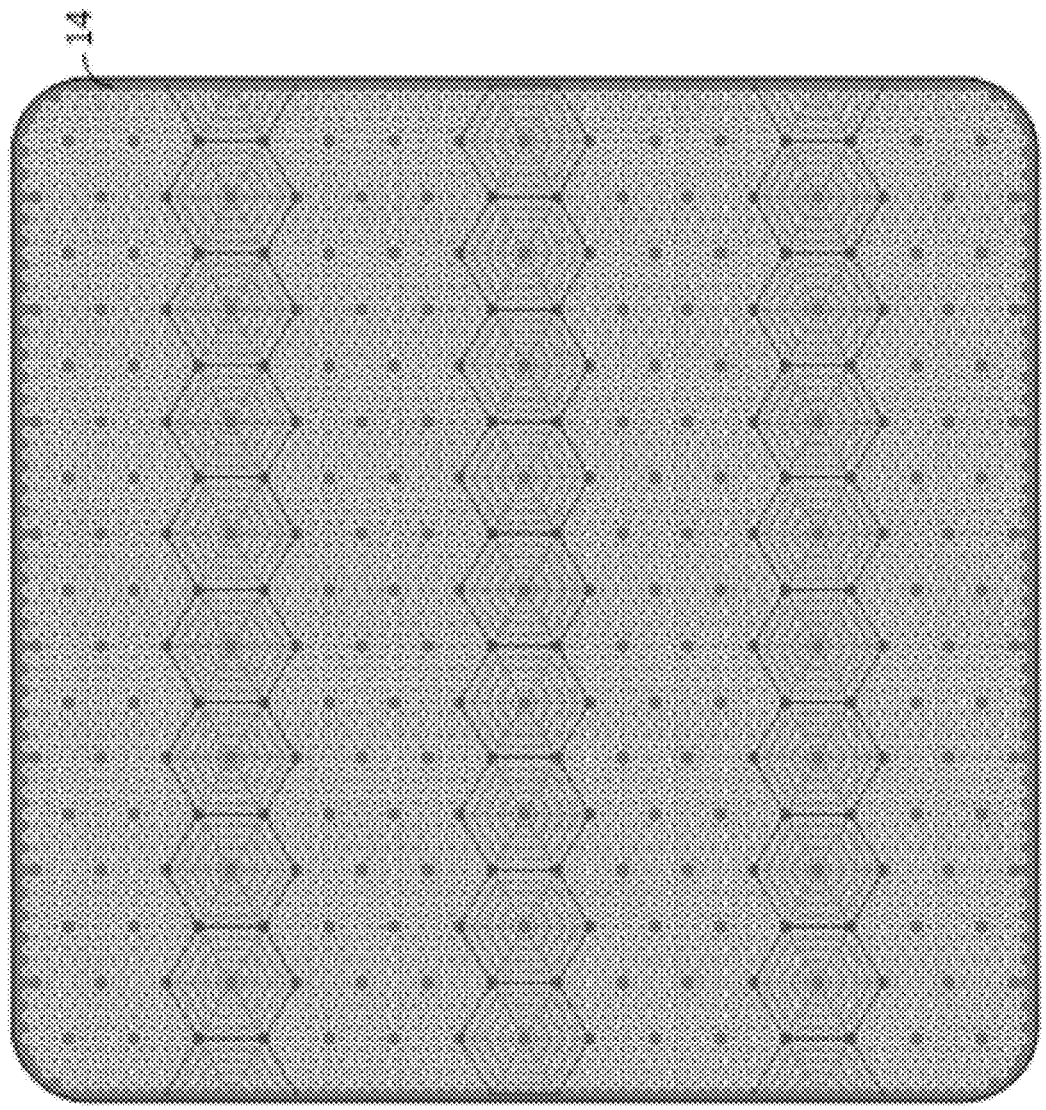
FIG. 9 is a schematic view of the merged PiN Schottky (MPS) diode with a first linear arrangement of the hexagonal cells, wherein there are two layers of the third type hexagonal cell between the adjacent layer of the fourth type hexagonal cell.
Figure 10:
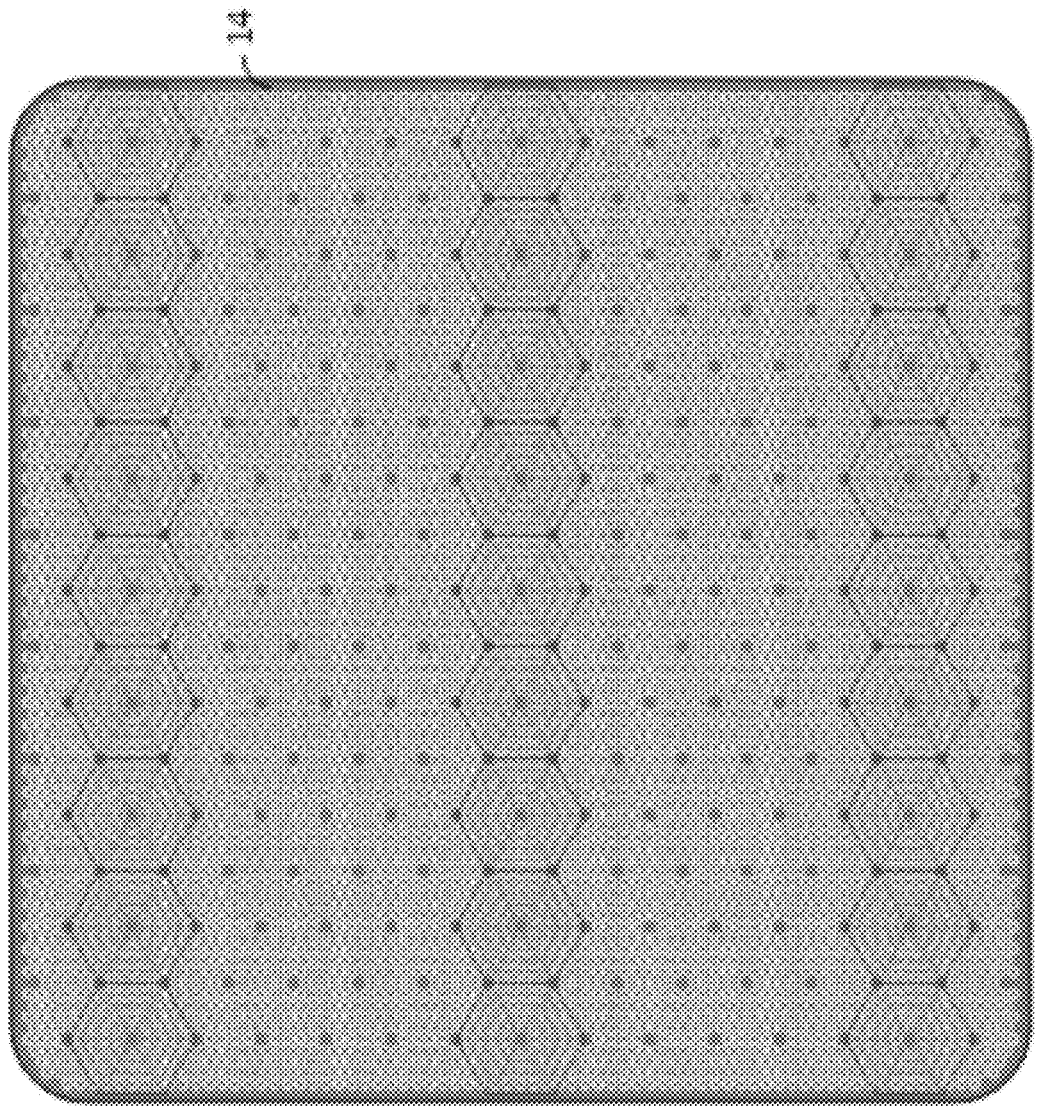
FIG. 10 is a schematic view of the merged PiN Schottky (MPS) diode with a first linear arrangement of the hexagonal cells, wherein there are three layers of the third type hexagonal cell between the adjacent layer of the fourth type hexagonal cell.
Figure 11:
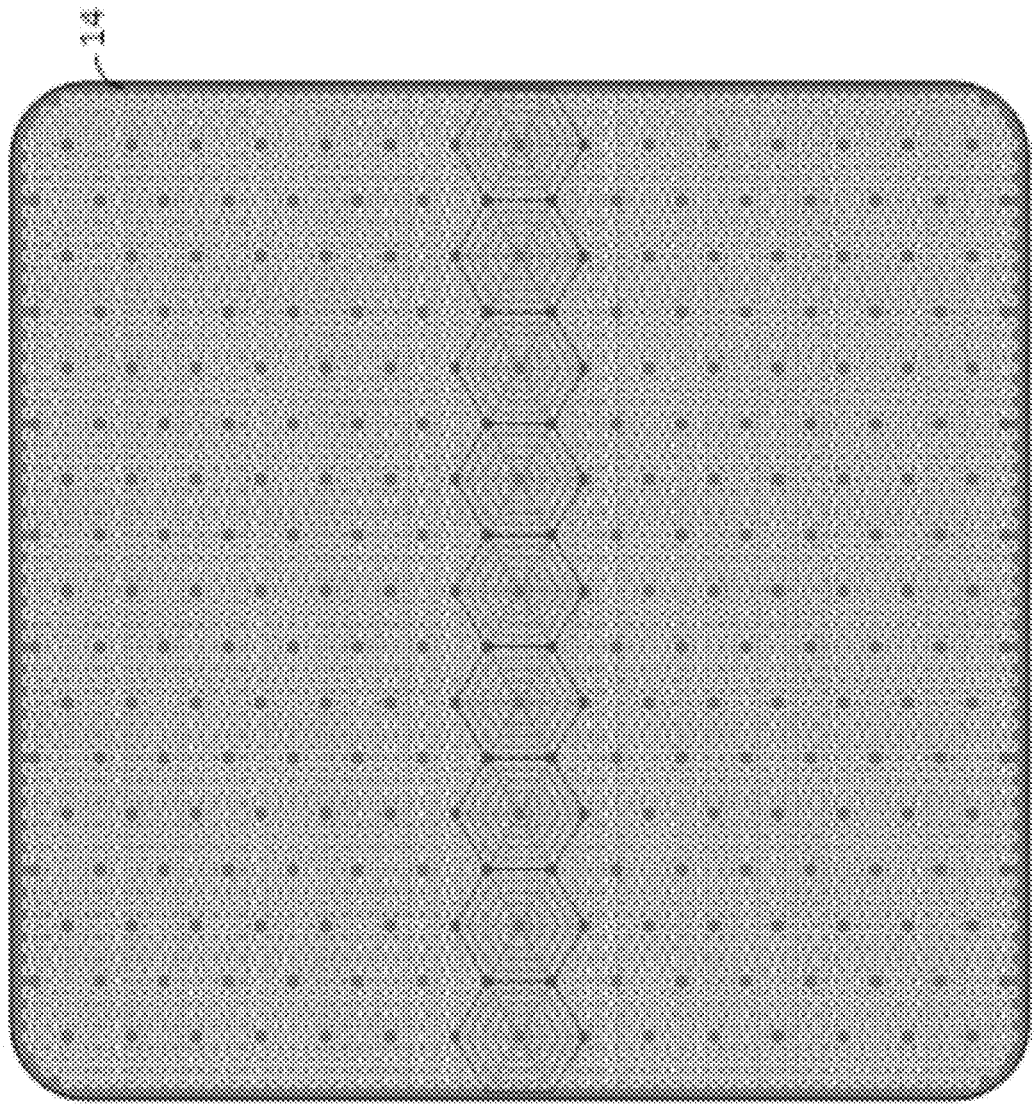
FIG. 11 is a schematic view of the merged PiN Schottky (MPS) diode with a first linear arrangement of the hexagonal cells, wherein there is one layer of the fourth type hexagonal cell.

As a result, the high surge current and dissipated energy can be evenly distributed within the device to effectively prevent the device from being damaged caused by localized heating, and to improve the surge current capability of the device. It is noted that the merged PiN Schottky (MPS) diode with different fourth type hexagonal unit density can be obtained, as shown in FIGS. 9 to 11. Furthermore, there can be n layer(s) of the third type hexagonal unit between the adjacent layer of the fourth type hexagonal unit, where n can be 0 to 200.

Figure 12:
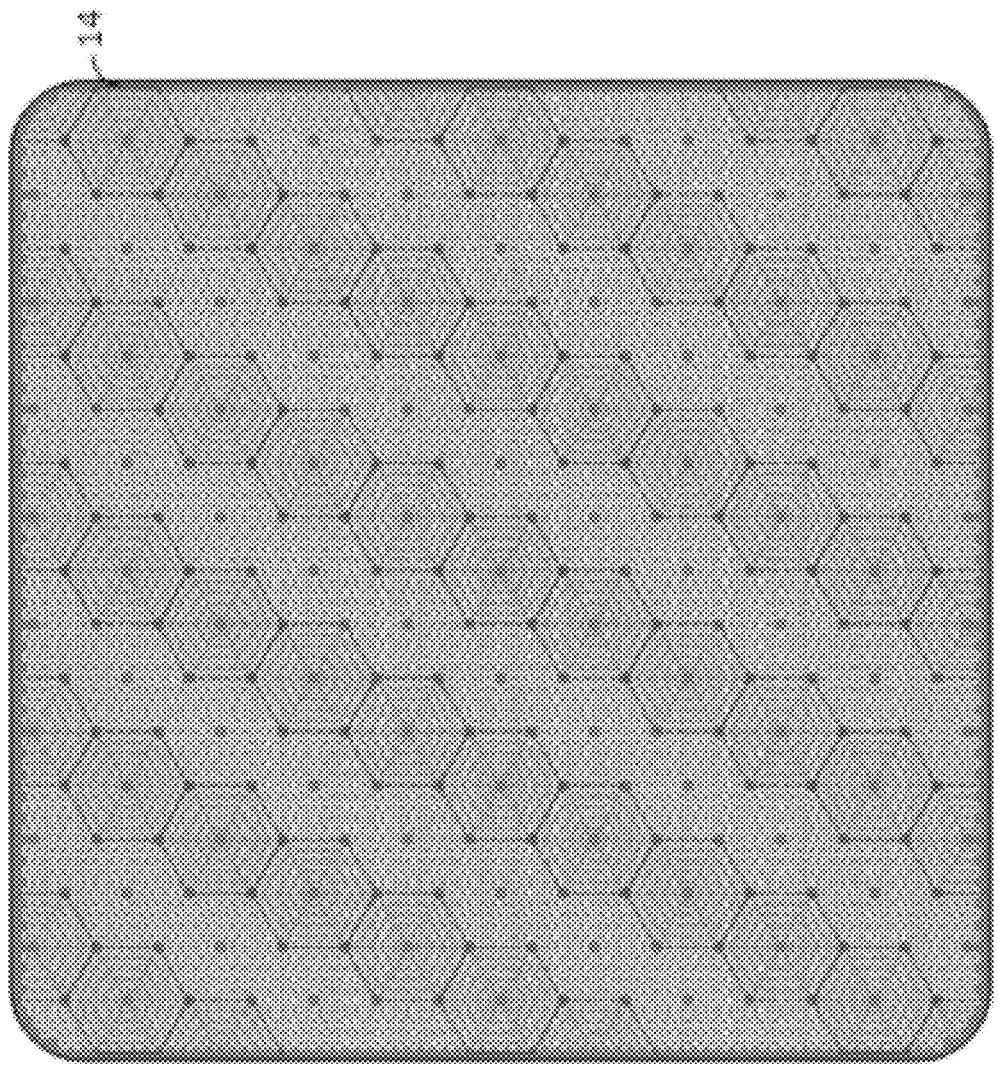
FIG. 12 is a schematic view of the merged PiN Schottky (MPS) diode with a second linear arrangement of the hexagonal cells, wherein there is one layer of the third type hexagonal cell between the adjacent layer of the fourth type hexagonal cell.
Figure 13:
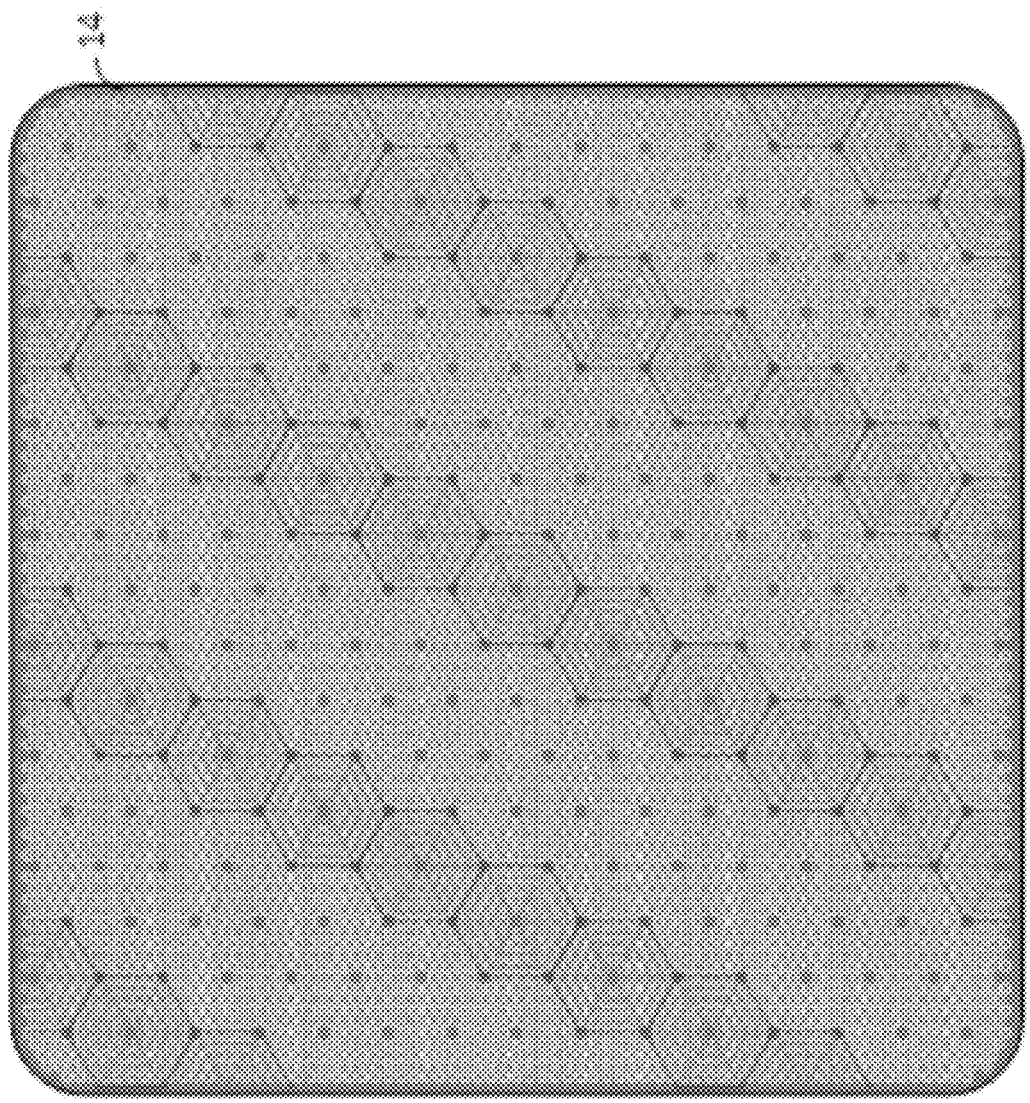
FIG. 13 is a schematic view of the merged PiN Schottky (MPS) diode with a second linear arrangement of the hexagonal cells, wherein there are two layers of the third type hexagonal cell between the adjacent layer of the fourth type hexagonal cell.
Figure 14:
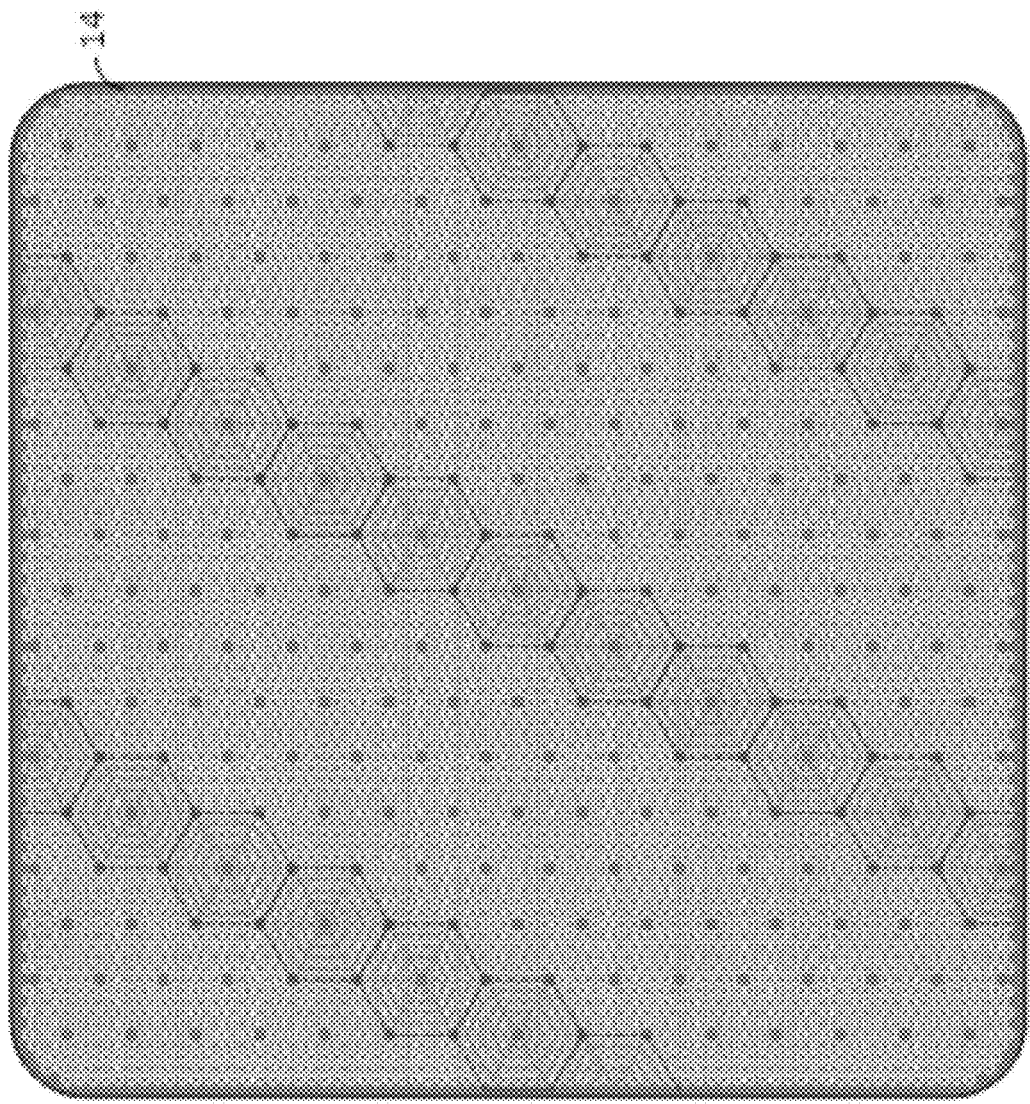
FIG. 14 is a schematic view of the merged PiN Schottky (MPS) diode with a second linear arrangement of the hexagonal cells, wherein there are three layers of the third type hexagonal cell between the adjacent layer of the fourth type hexagonal cell.
Figure 15:
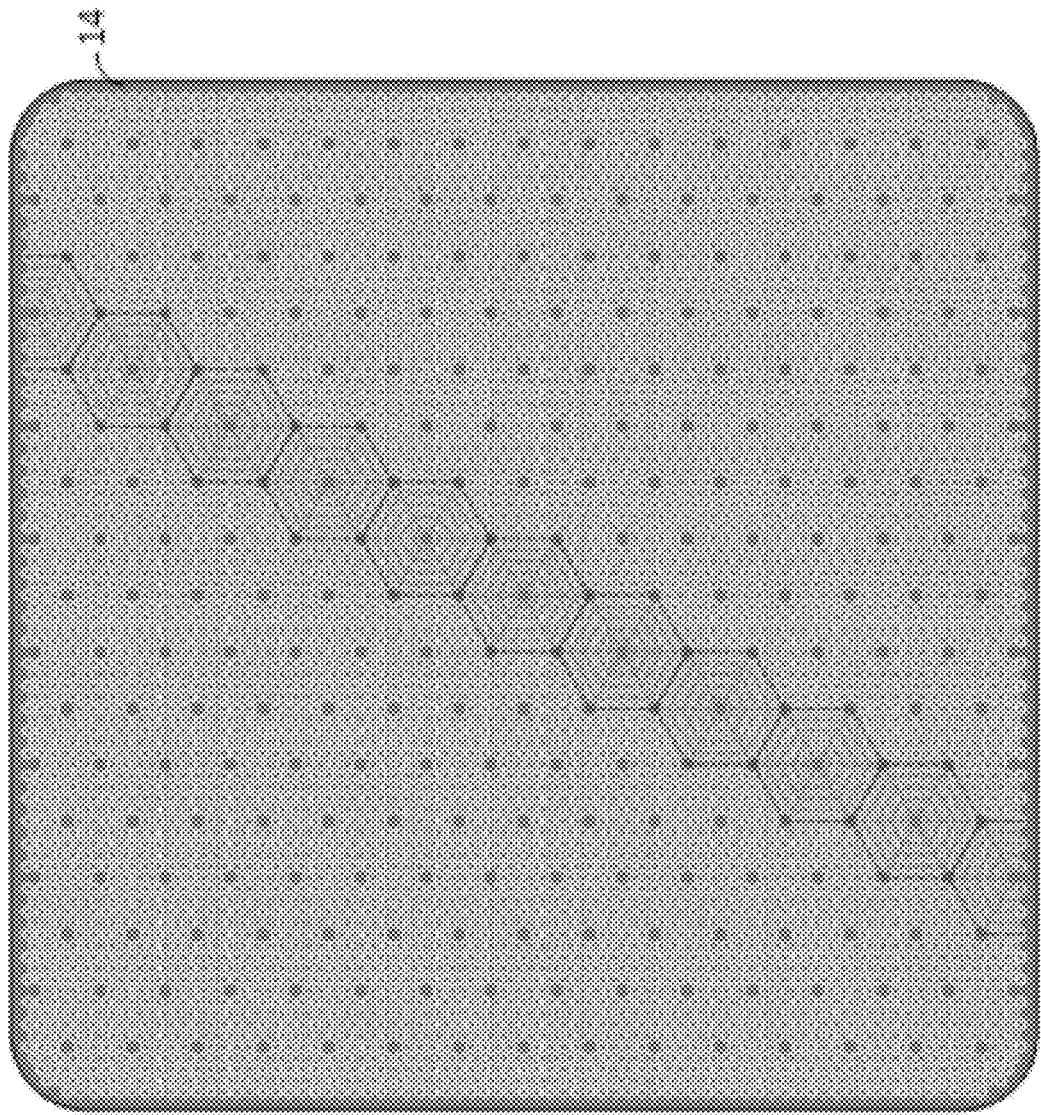
FIG. 15 is a schematic view of the merged PiN Schottky (MPS) diode with a second linear arrangement of the hexagonal cells, wherein there is one layer of the fourth type hexagonal cell.
Figure 16:
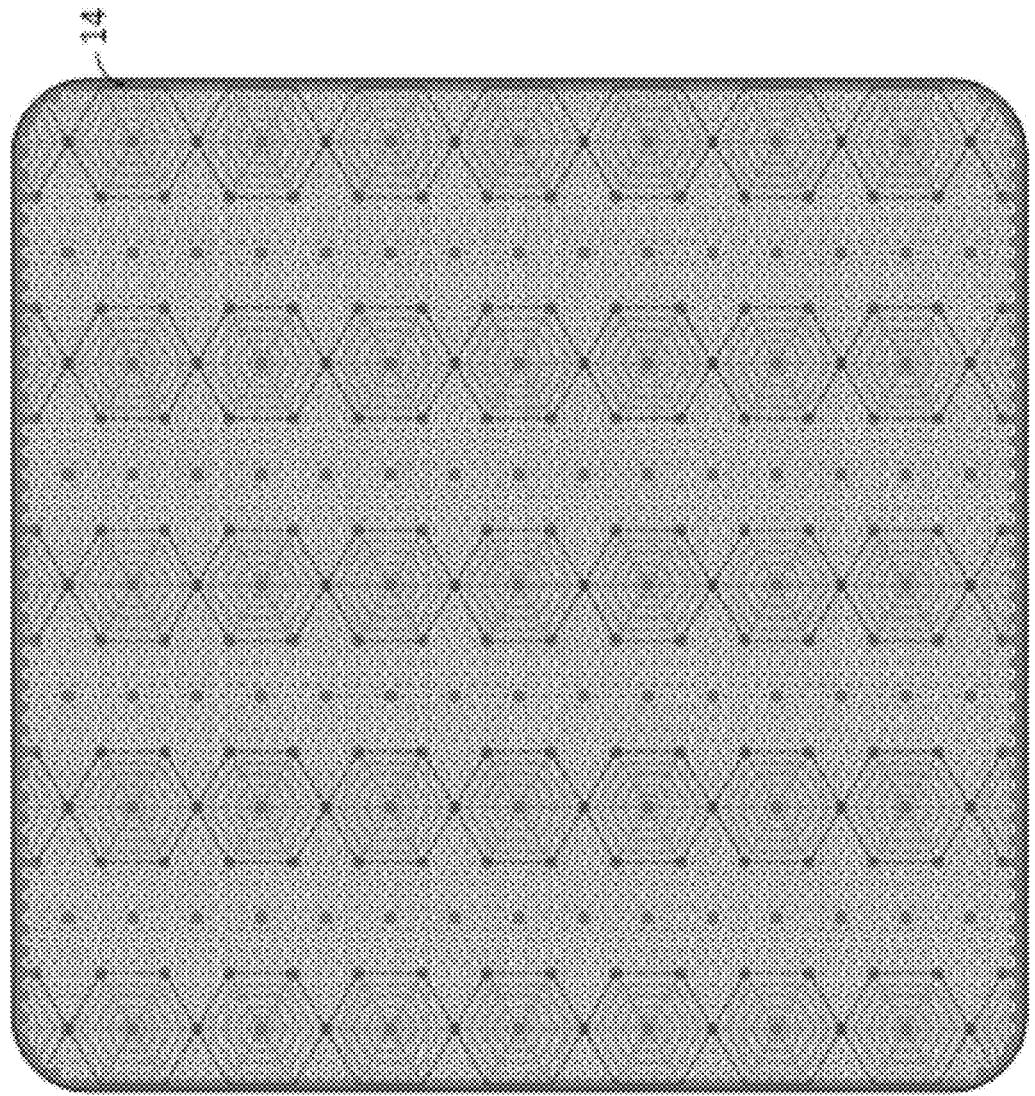
FIG. 16 is a schematic view of the merged PiN Schottky (MPS) diode with a third linear arrangement of the hexagonal cells, wherein there is one layer of the third type hexagonal cell between the adjacent layer of the fourth type hexagonal cell.

In another embodiment, the first linear arrangement can be rotated by 60 degrees to form a second linear arrangement as shown in FIG. 12. Similarly, the merged PiN Schottky (MPS) diode with different fourth type hexagonal unit density can be obtained, as shown in FIGS. 13 to 15. Furthermore, there can be n layer(s) of the third type hexagonal unit between the adjacent layer of the fourth type hexagonal unit, where n can be 0 to 200.

Figure 17:
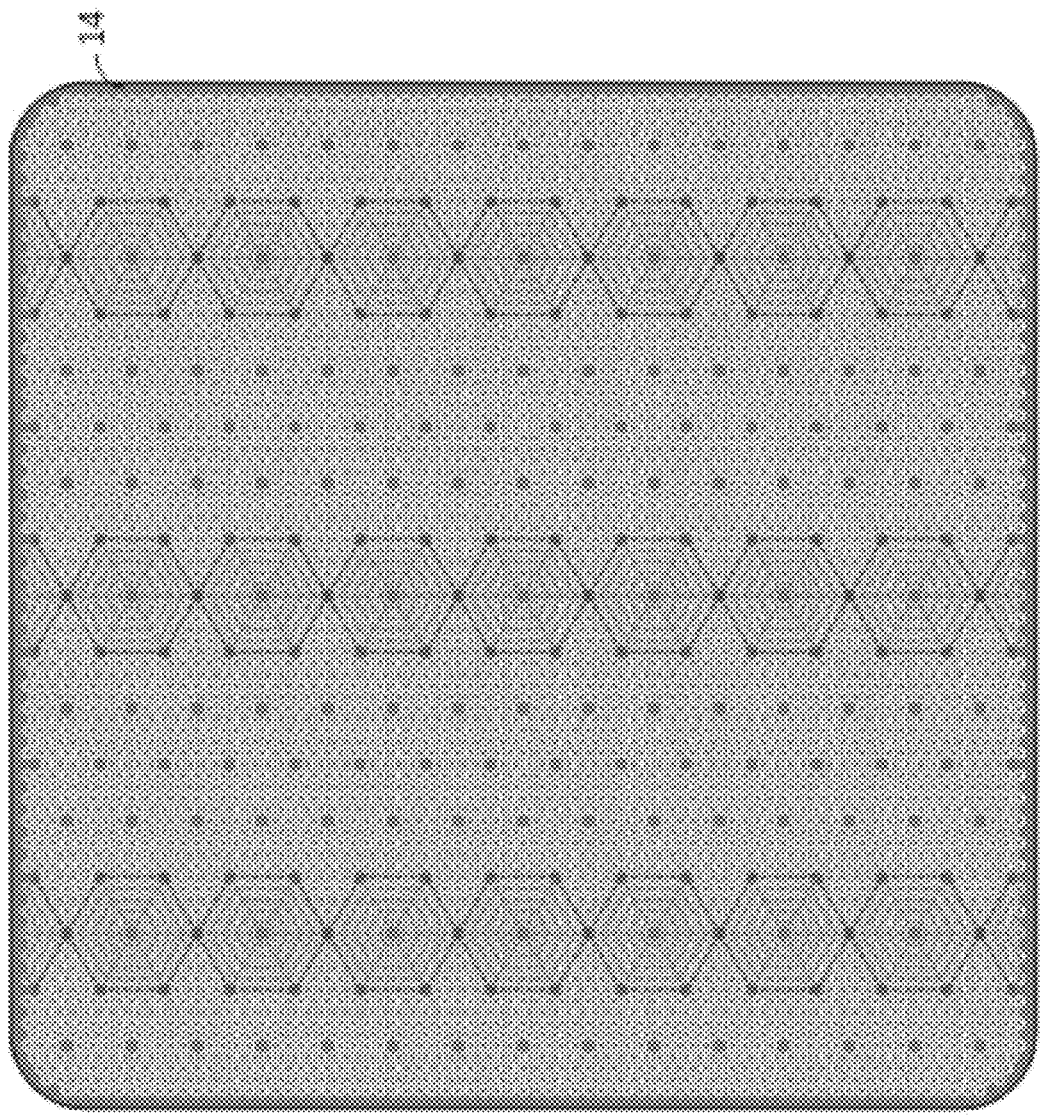
FIG. 17 is a schematic view of the merged PiN Schottky (MPS) diode with a third linear arrangement of the hexagonal cells, wherein there are two layers of the third type hexagonal cell between the adjacent layer of the fourth type hexagonal cell.
Figure 18:
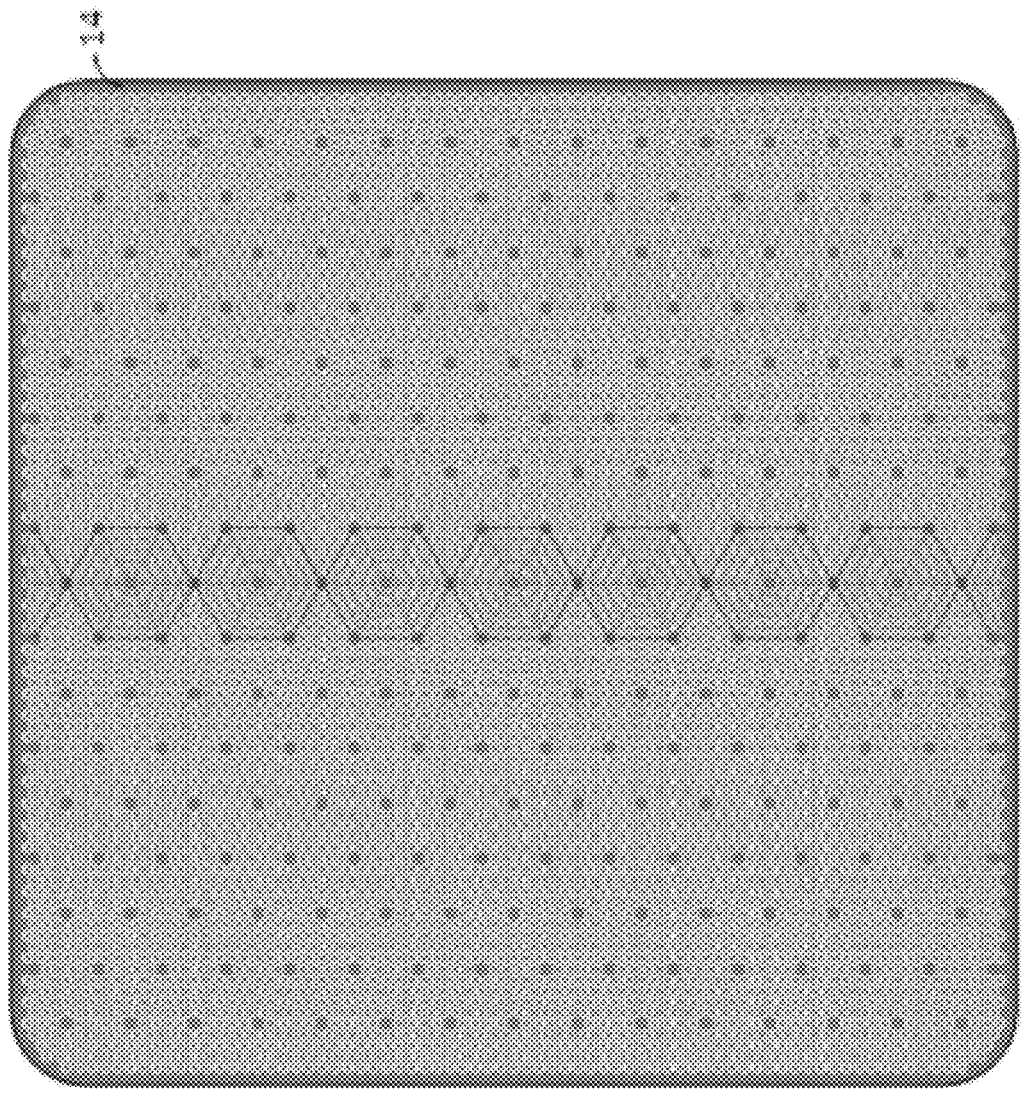
FIG. 18 is a schematic view of the merged PiN Schottky (MPS) diode with a third linear arrangement of the hexagonal cells, wherein there are three layers of the third type hexagonal cell between the adjacent layer of the fourth type hexagonal cell.

In still another embodiment, different from the first linear arrangement, a third linear arrangement can be formed through the connection of the diagonal points between the adjacent fourth type hexagonal unit. Similarly, the merged PiN Schottky (MPS) diode with different fourth type hexagonal unit density can be obtained, as shown in FIGS. 17 and 18. Furthermore, there can be n layer(s) of the third type hexagonal unit between the adjacent layer of the fourth type hexagonal unit, where n can be 0 to 200.

Figure 19:
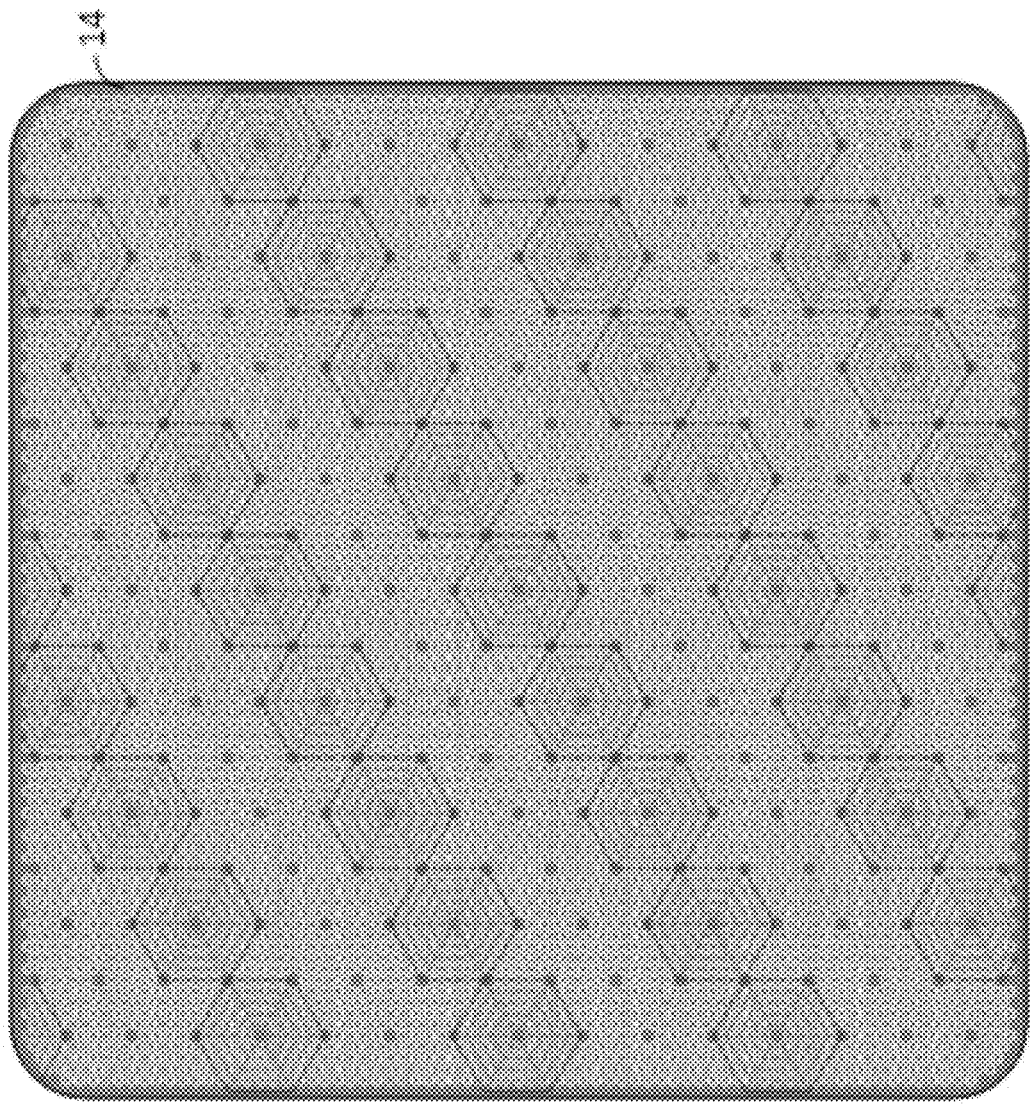
FIG. 19 is a schematic view of the merged PiN Schottky (MPS) diode with a fourth linear arrangement of the hexagonal cells, wherein there is one layer of the third type hexagonal cell between the adjacent layer of the fourth type hexagonal cell.
Figure 20:
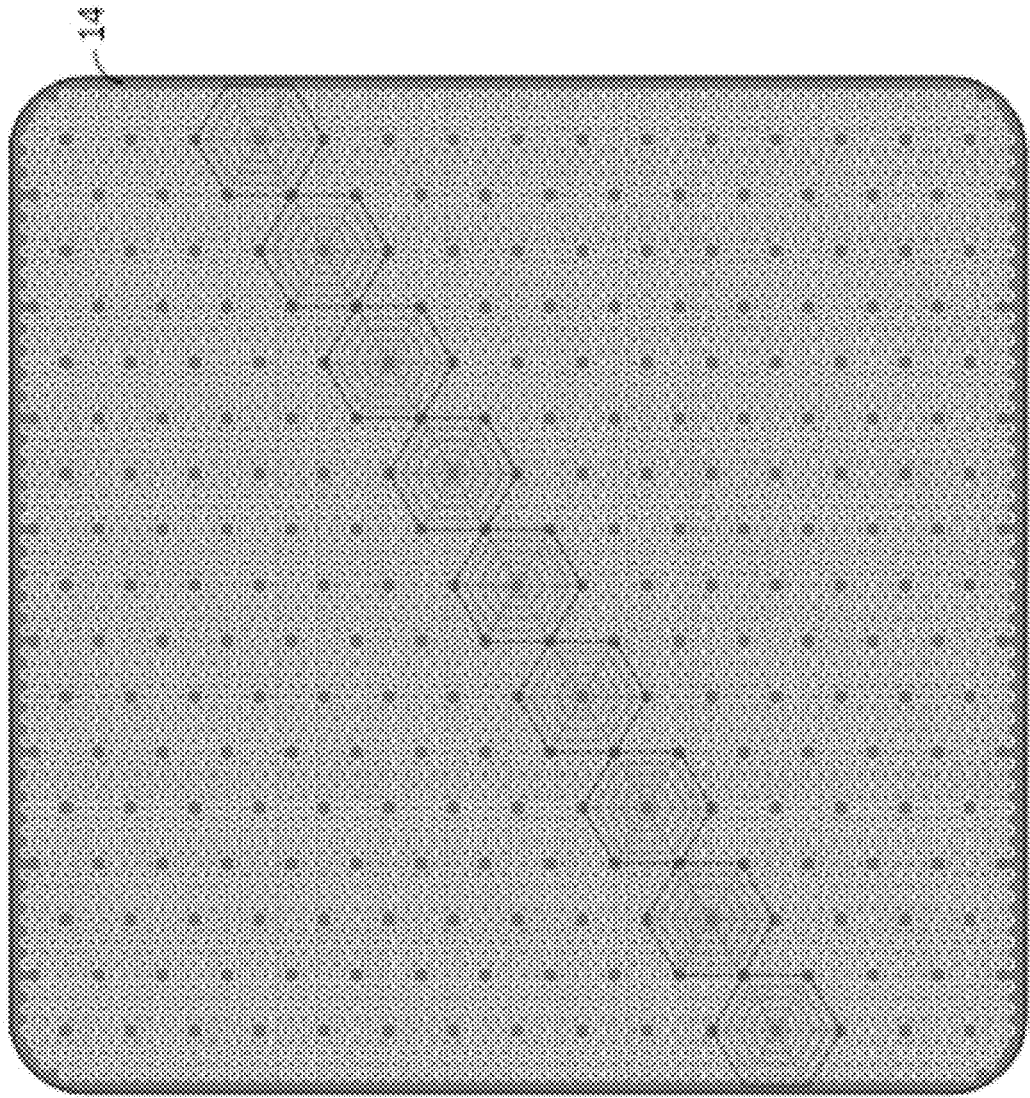
FIG. 20 is a schematic view of the merged PiN Schottky (MPS) diode with a fourth linear arrangement of the hexagonal cells, wherein there is one layer of the fourth type hexagonal cell.

In a different embodiment, the third linear arrangement can be rotated 60 degrees to form a fourth linear arrangement as shown in FIG. 19. Again, the merged PiN Schottky (MPS) diode with different fourth type hexagonal unit density can be obtained, as shown in FIGS. 19 and 20. Furthermore, there can be n layer(s) of the third type hexagonal unit between the adjacent layer of the fourth type hexagonal unit, where n can be 0 to 200.

Figure 21:
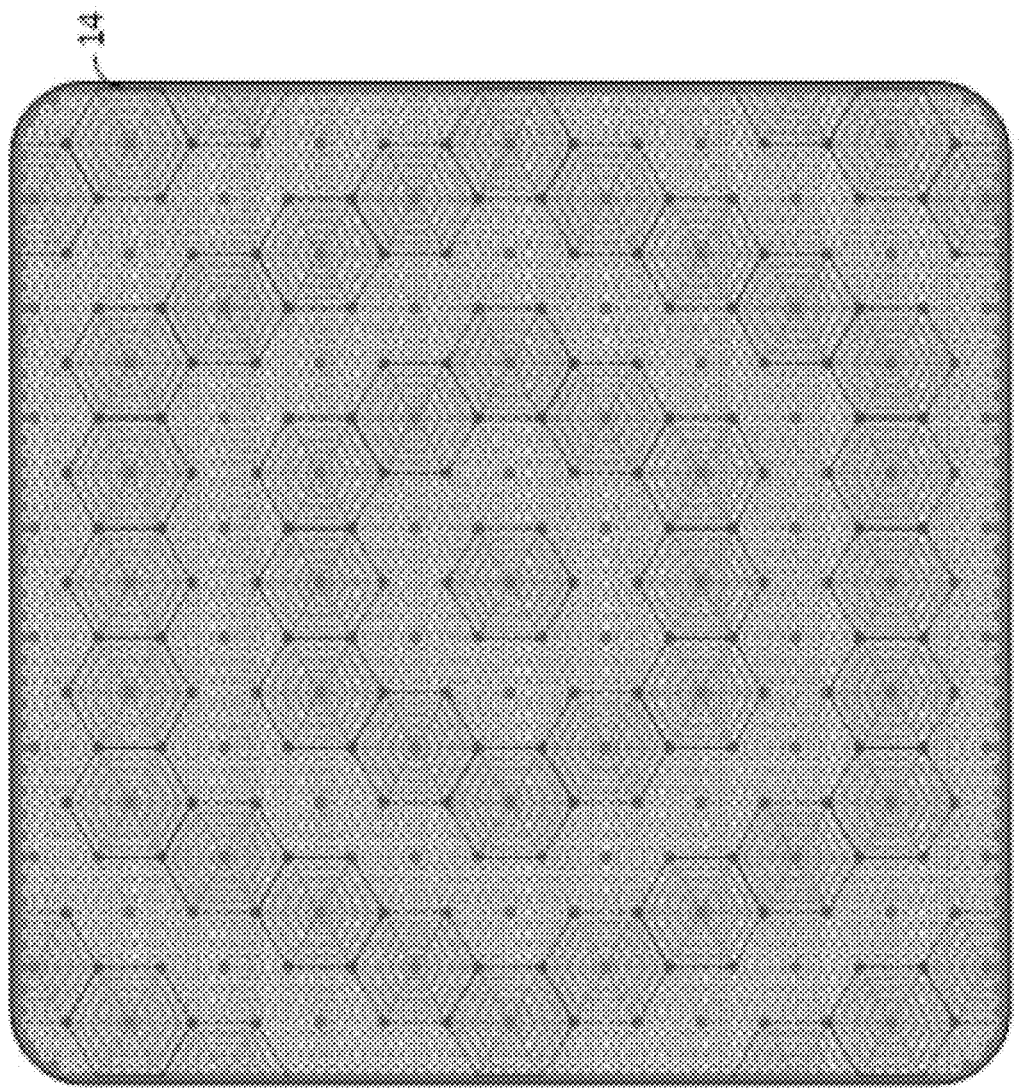
FIG. 21 is a schematic view of a merged PiN Schottky (MPS) diode with a ring arrangement of the hexagonal cells, wherein there is one layer of the third type hexagonal cell between the adjacent layer of the fourth type hexagonal cell.
Figure 22:
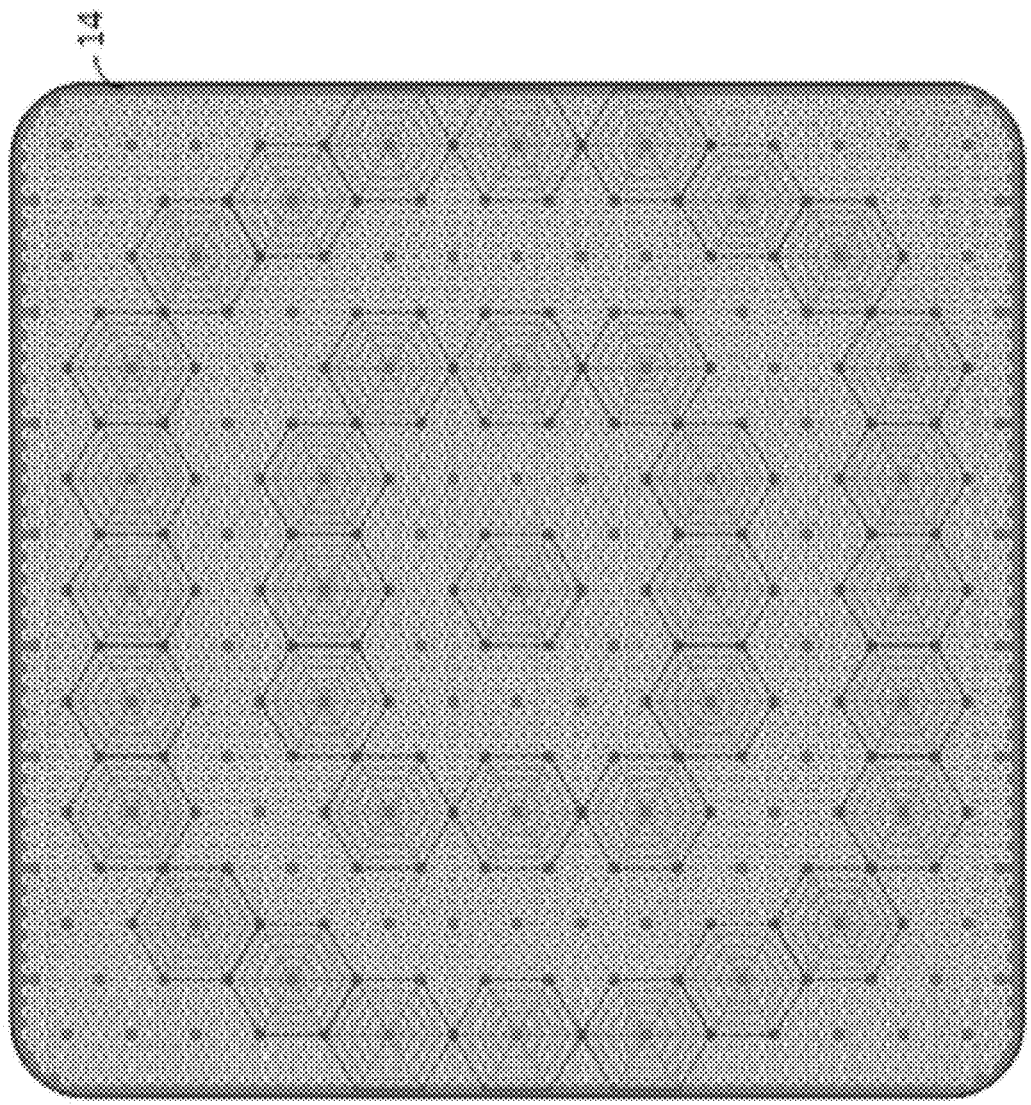
FIG. 22 is a schematic view of a merged PiN Schottky (MPS) diode with another ring arrangement of the hexagonal cells, wherein there is one layer of the third type hexagonal cell between the adjacent layer of the fourth type hexagonal cell.
Figure 23:
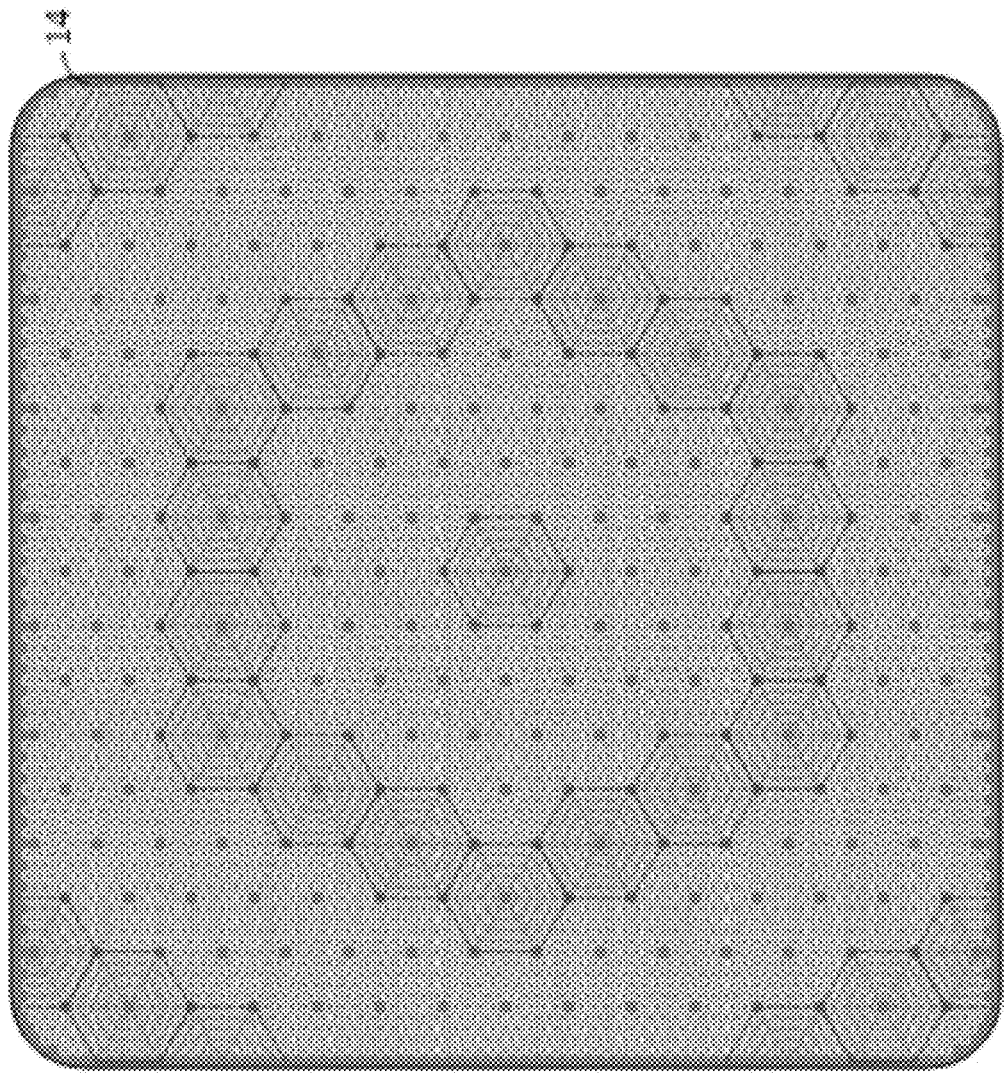
FIG. 23 is a schematic view of a merged PiN Schottky (MPS) diode with a ring arrangement of the hexagonal cells, wherein there are two layers of the third type hexagonal cell between the adjacent layer of the fourth type hexagonal cell.
Figure 24:
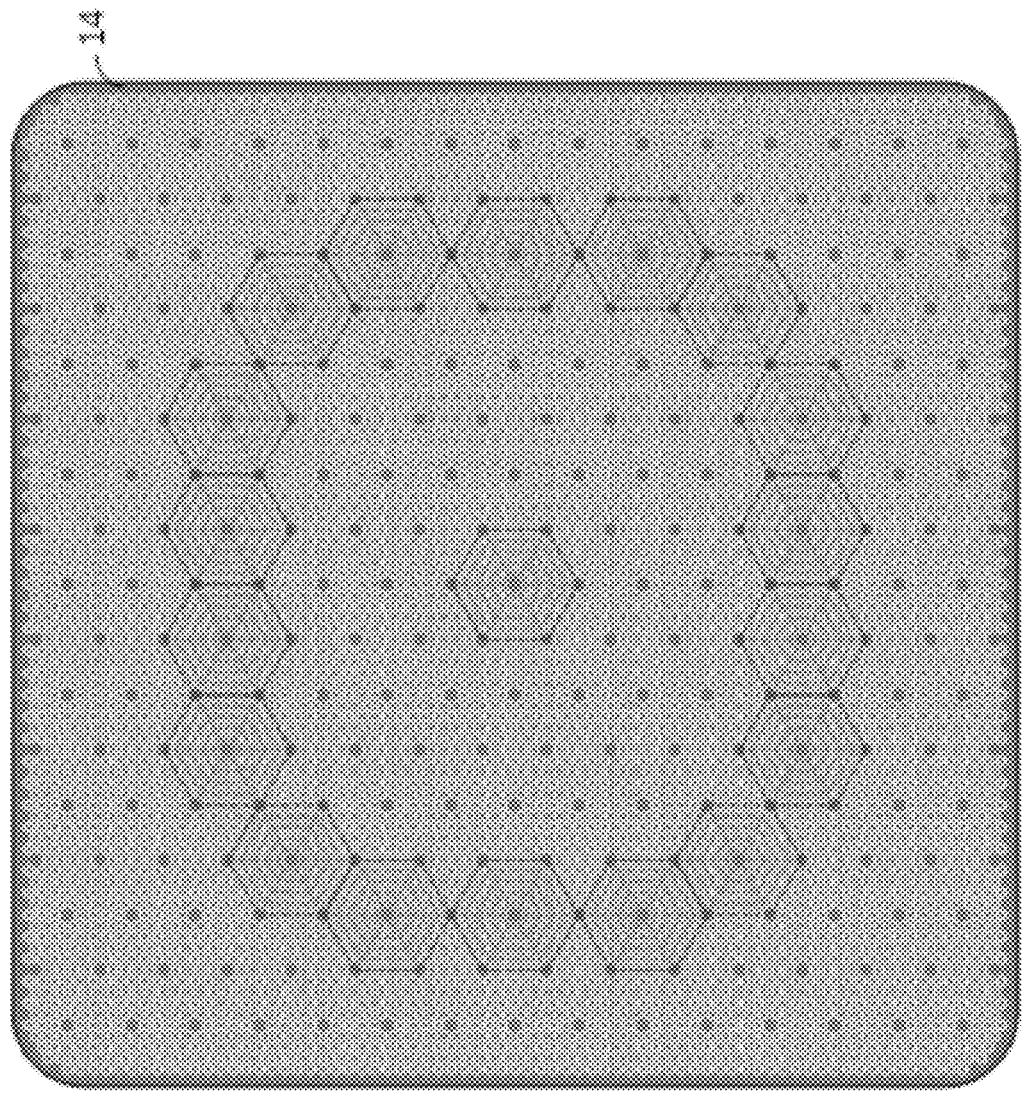
FIG. 24 is a schematic view of a merged PiN Schottky (MPS) diode with another ring arrangement of the hexagonal cells, wherein there are two layers of the third type hexagonal cell between the adjacent layer of the fourth type hexagonal cell.

In addition to the linear arrangements mentioned above, the fourth type hexagonal unit can also form a ring arrangement shown in FIGS. 21 and 22. It is noted that the shape of the ring arrangement can be circle, ellipse, rectangle, other regular geometries, or irregular geometries. Similar with the linear arrangement, the density of the fourth type hexagonal unit arrangement can be adjusted, as shown in FIGS. 23 and 24. Furthermore, there can be n layer(s) of the third type hexagonal unit between the adjacent layer of the fourth type hexagonal unit, where n can be 0 to 200.

Figure 25:
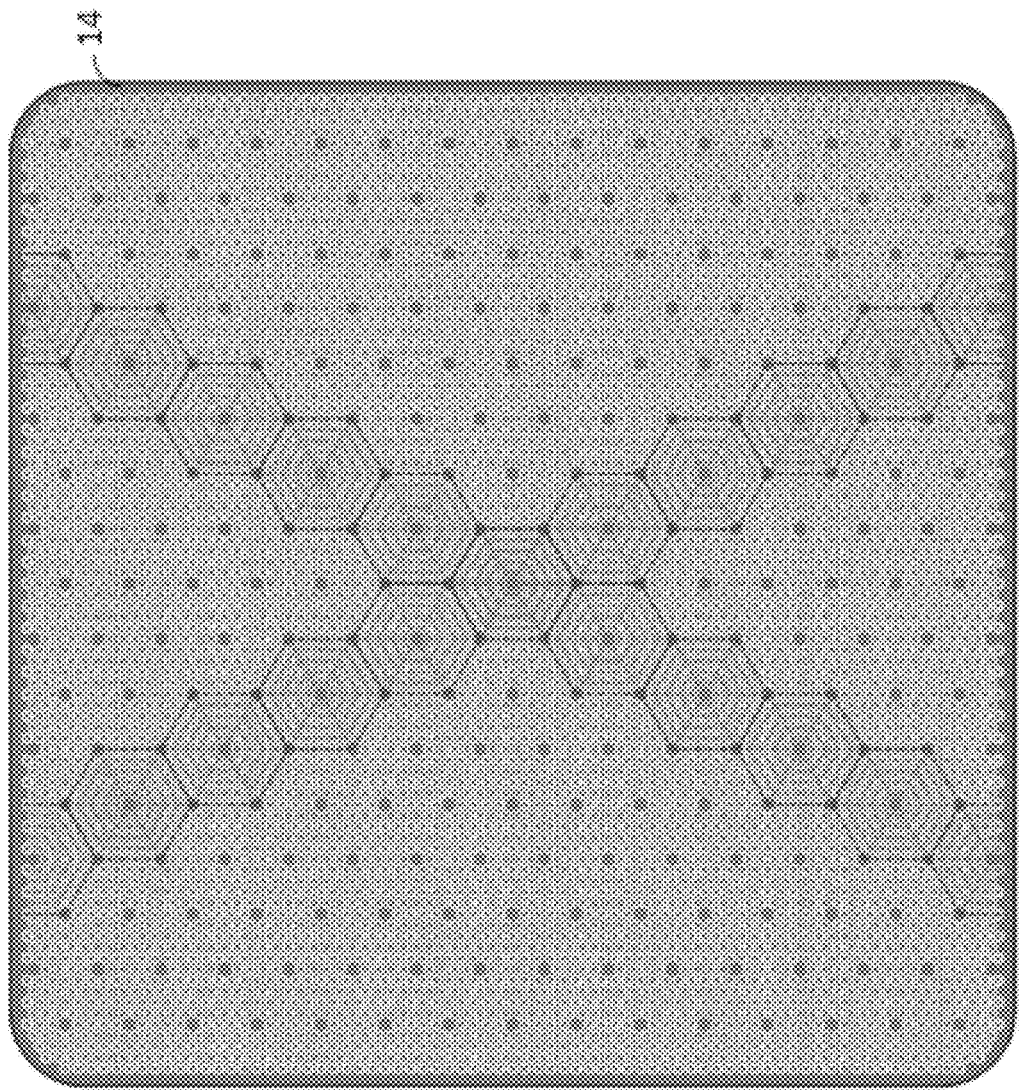
FIG. 25 is a schematic view of a merged PiN Schottky (MPS) diode with a cross-networking plasma spreading layer through a symmetric transformation of the second linear arrangement in FIG. 15.
Figure 26:
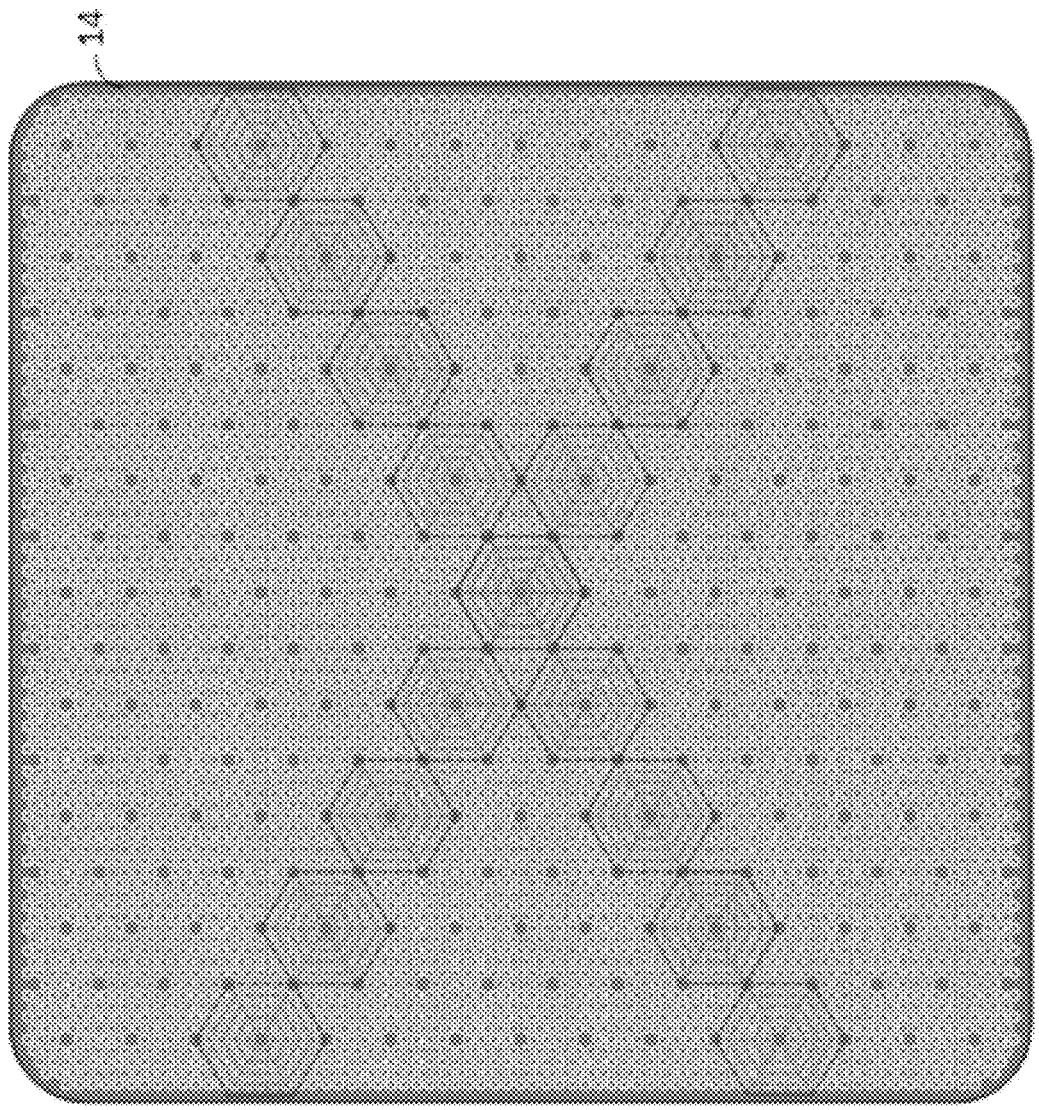
FIG. 26 is a schematic view of a merged PiN Schottky (MPS) diode with a cross-networking plasma spreading layer through a symmetric transformation of the fourth linear arrangement in FIG. 20.
Figure 27:
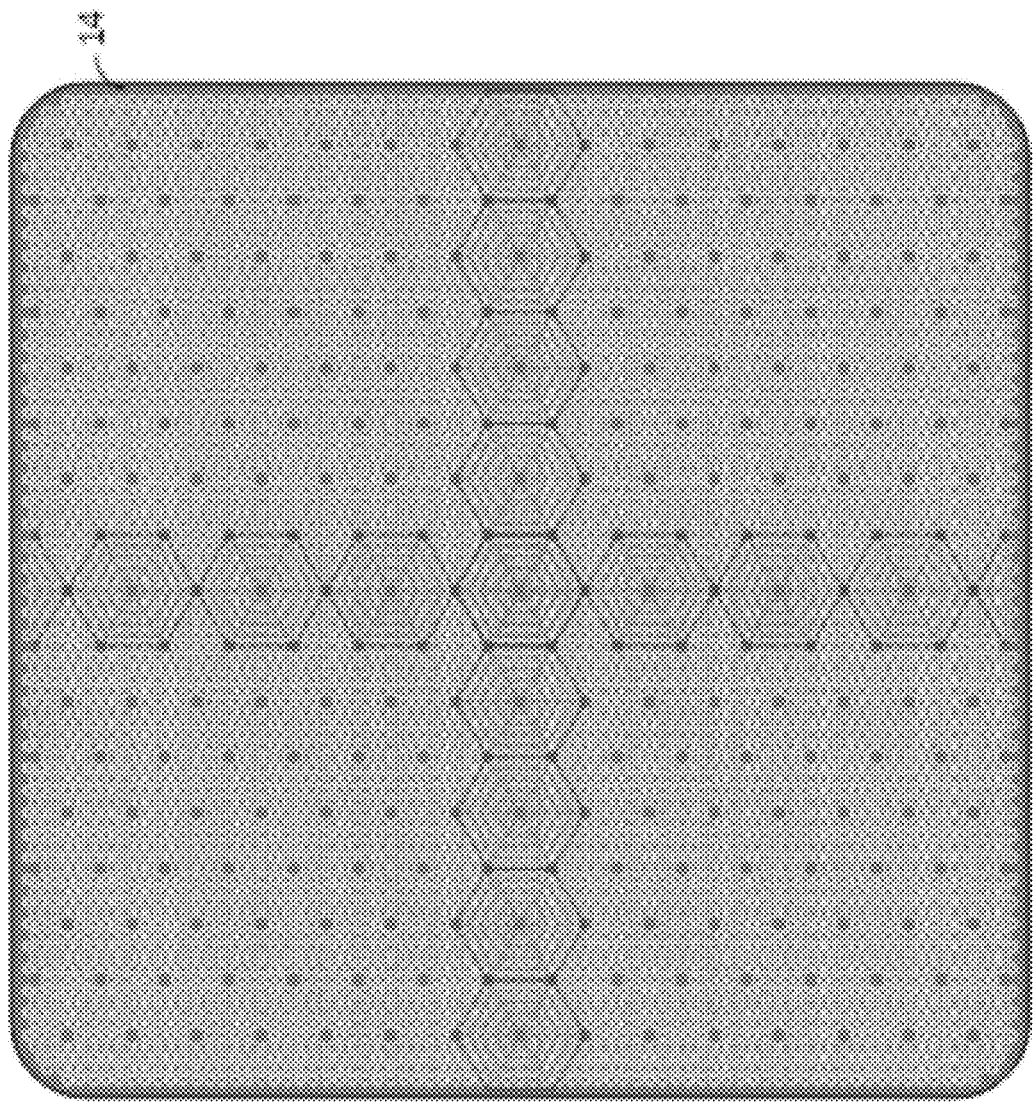
FIG. 27 is a schematic view of a merged PiN Schottky (MPS) diode with a cross-networking plasma spreading layer through a combination of FIGS. 11 and 18.
Figure 28:
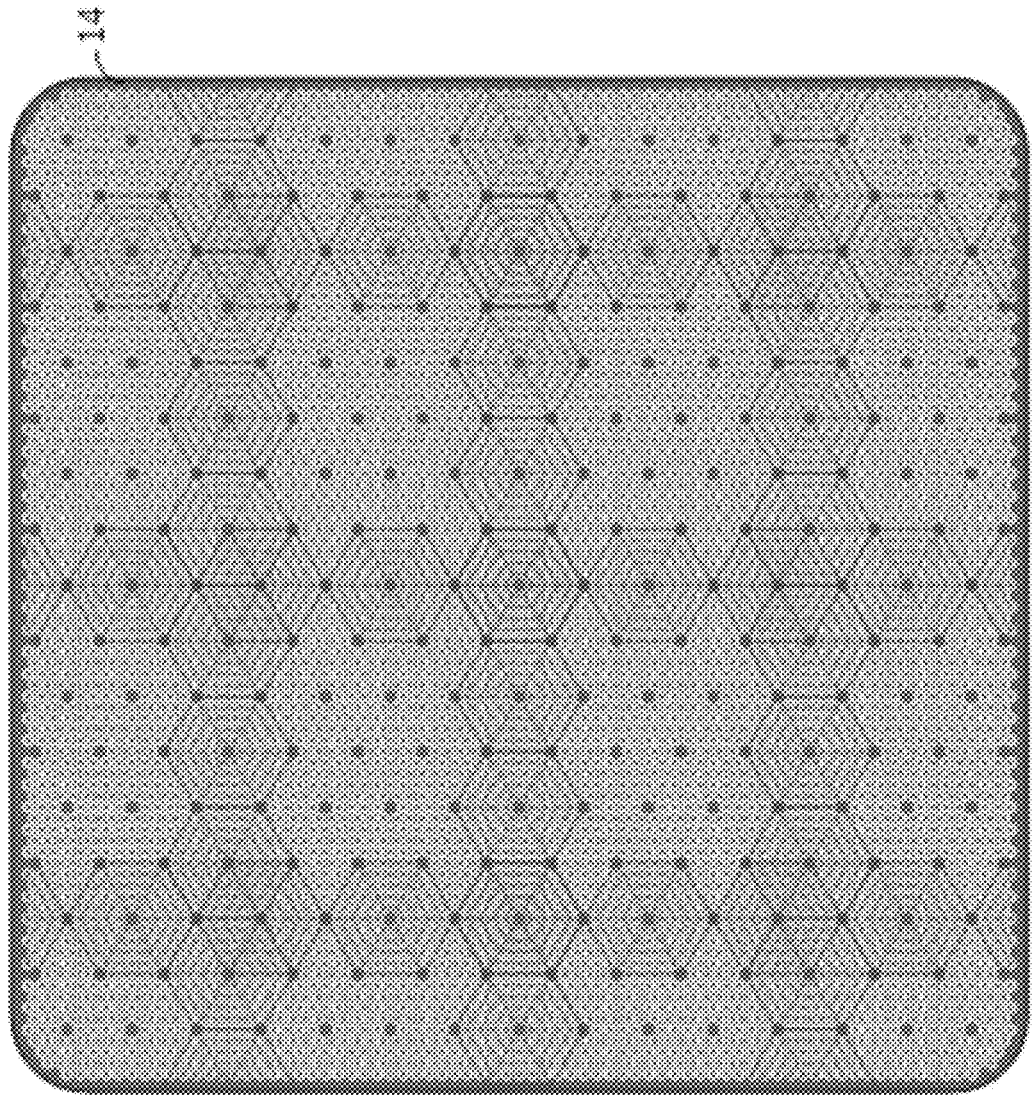
FIG. 28 is a schematic view of a merged PiN Schottky (MPS) diode with a cross-networking plasma spreading layer through a combination of FIGS. 10 and 17.
Figure 29:
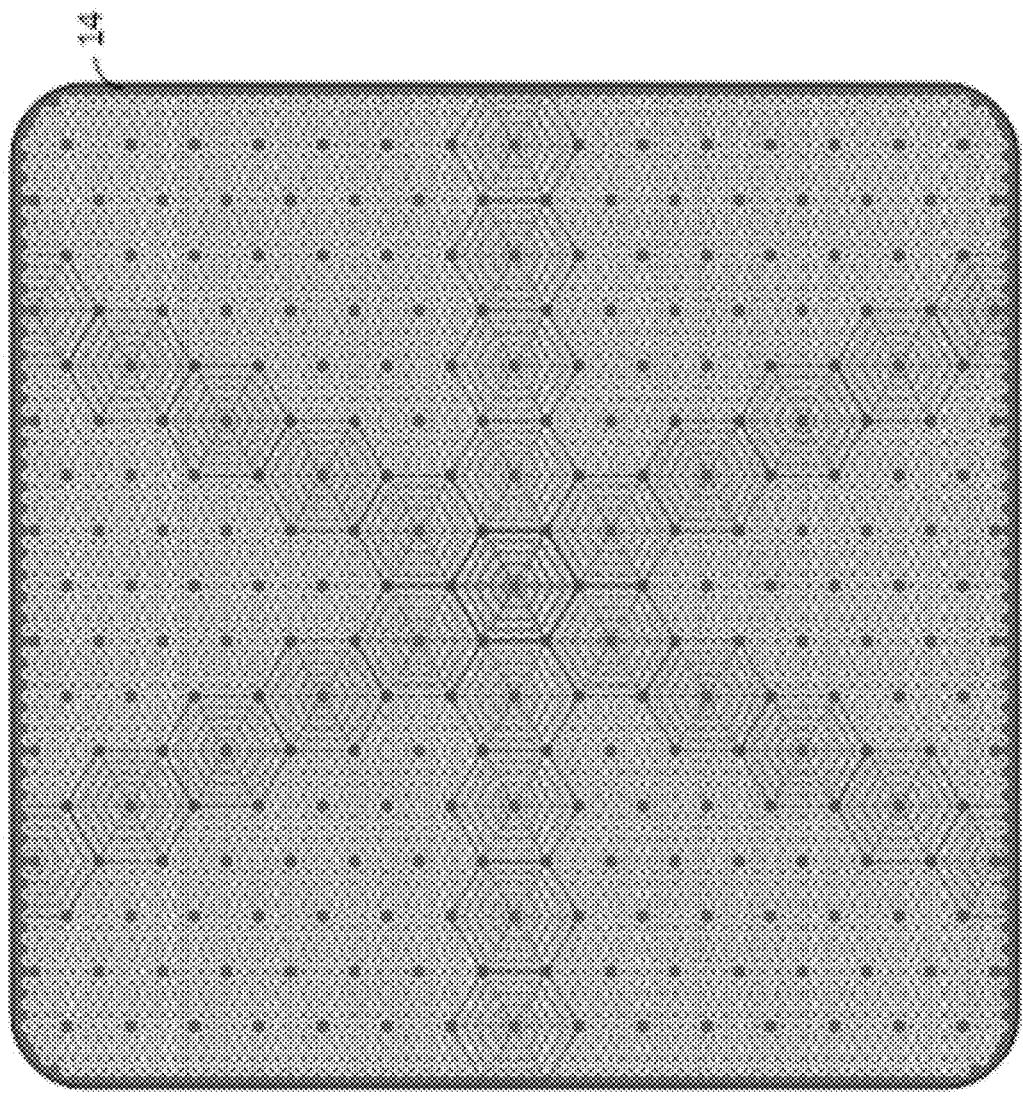
FIG. 29 is a schematic view of a merged PiN Schottky (MPS) diode with a cross-networking plasma spreading layer through a combination of FIGS. 11 and 25.
Figure 30:
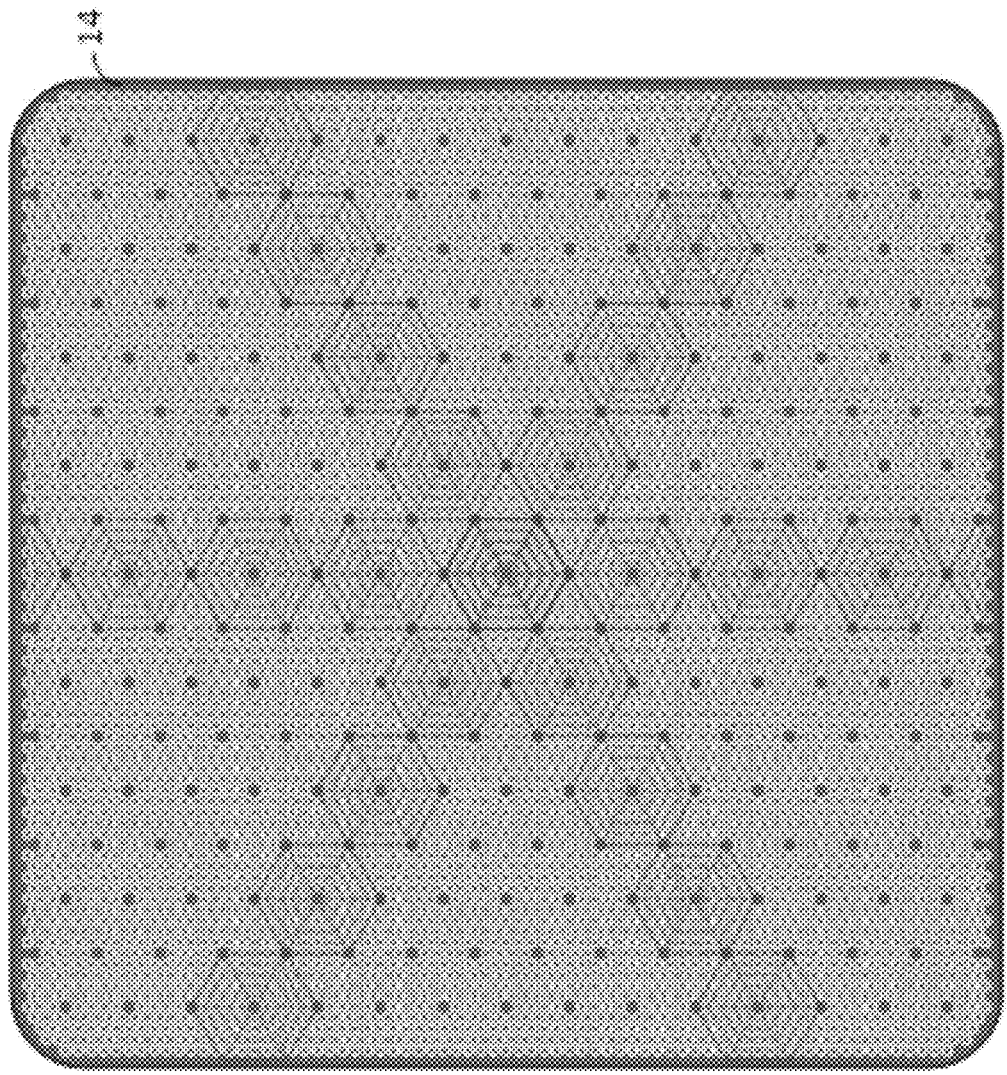
FIG. 30 is a schematic view of a merged PiN Schottky (MPS) diode with a cross-networking plasma spreading layer through a combination of FIGS. 18 and 26.
Figure 31:
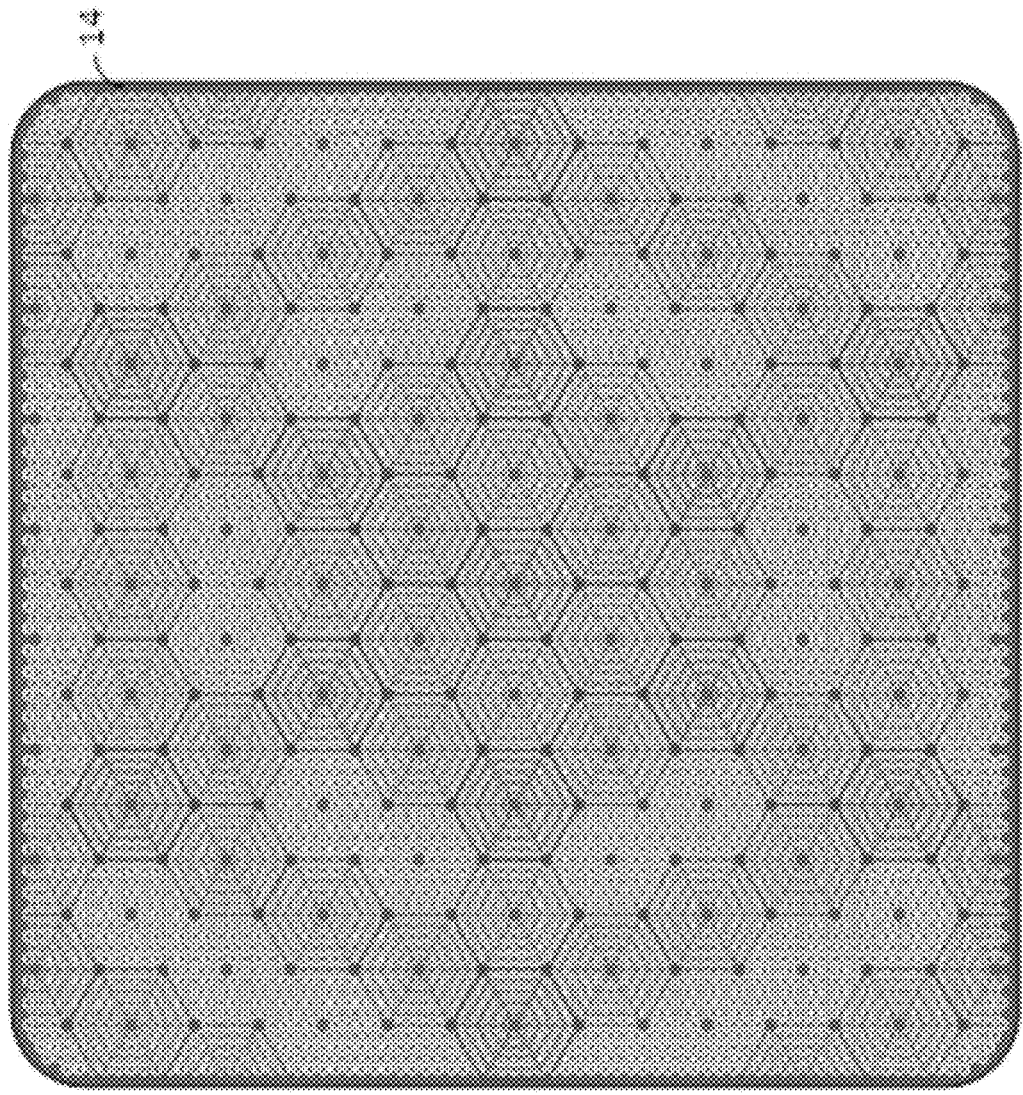
FIG. 31 is a schematic view of a merged PiN Schottky (MPS) diode with a cross-networking plasma spreading layer through a combination of FIGS. 21 and 29.
Figure 32:
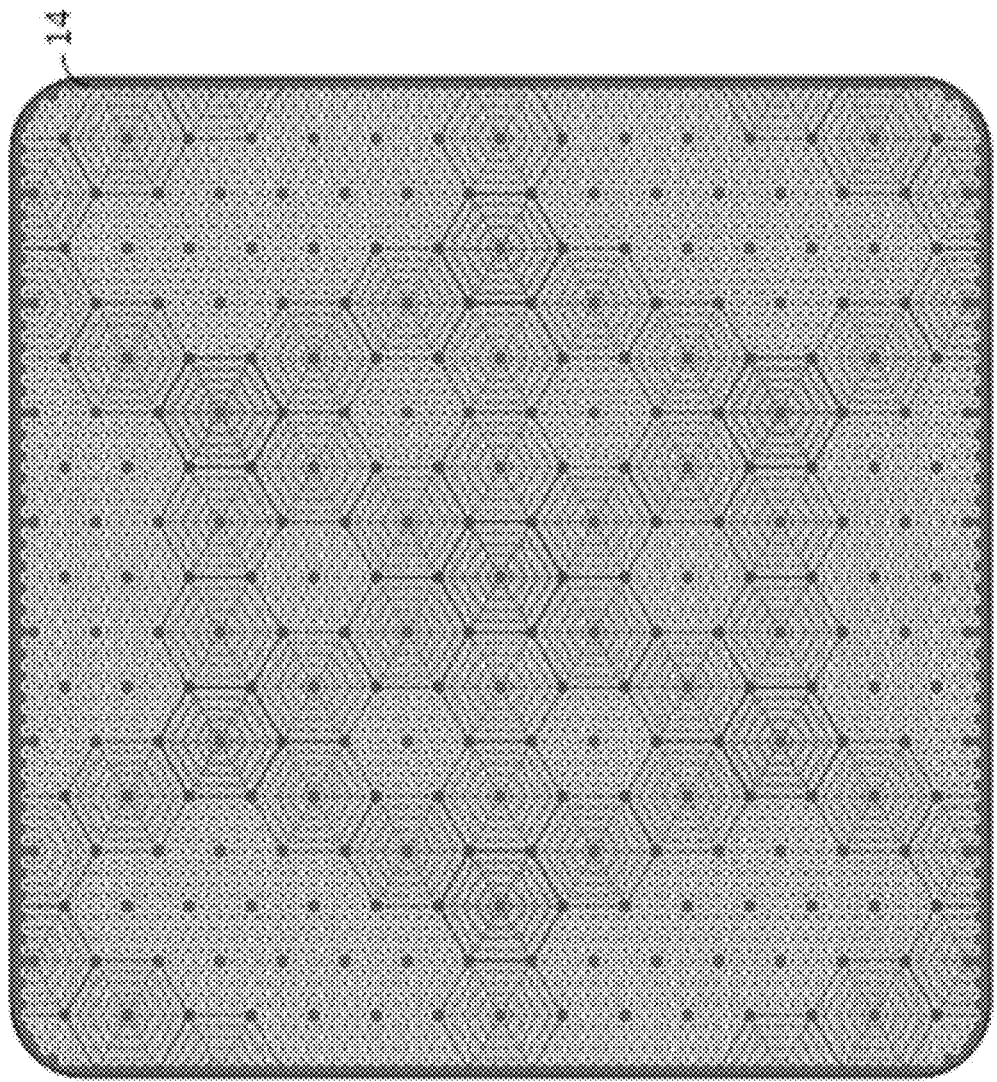
FIG. 32 is a schematic view of a merged PiN Schottky (MPS) diode with a cross-networking plasma spreading layer through a combination of FIGS. 23 and 29.
Figure 33:
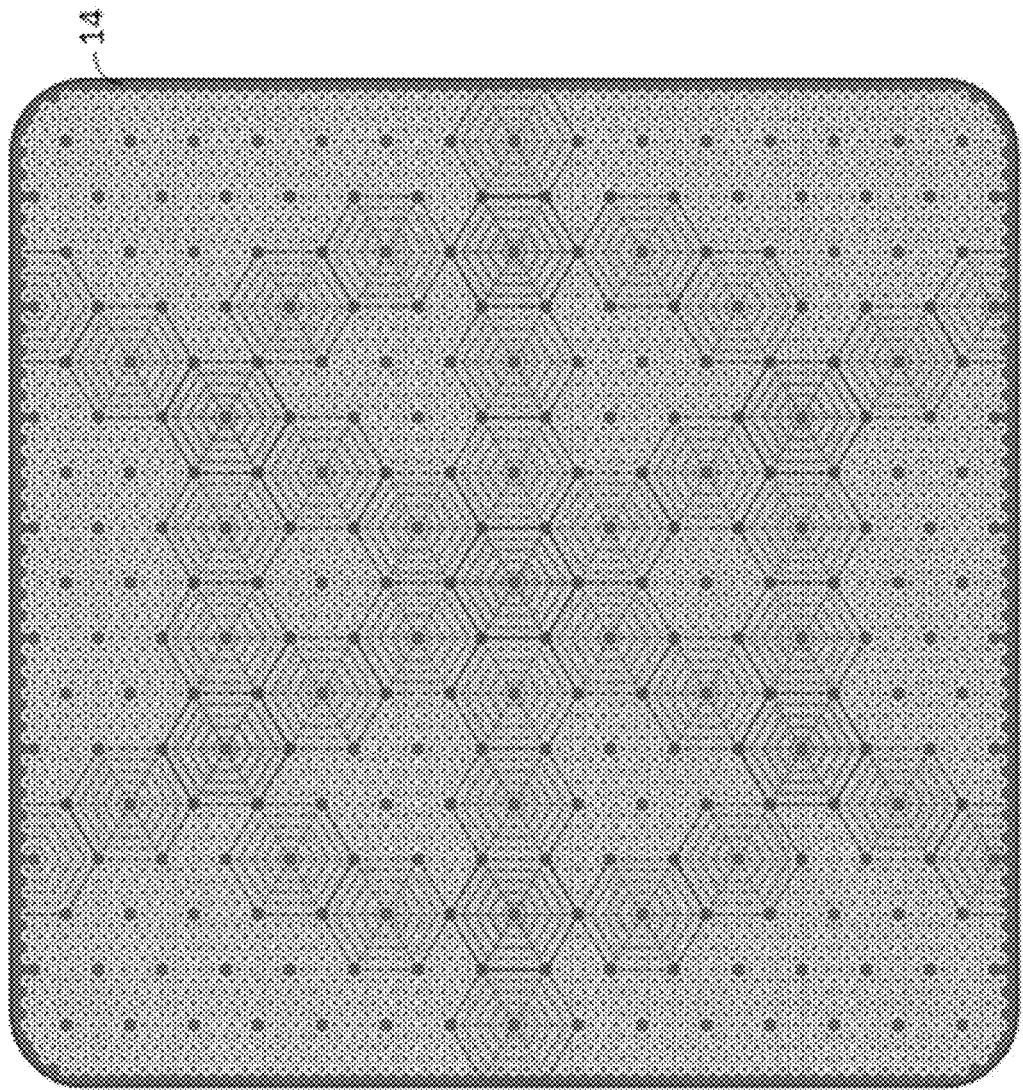
FIG. 33 is a schematic view of a merged PiN Schottky (MPS) diode with a cross-networking plasma spreading layer through a combination of FIGS. 24 and 29.

In a further embodiment, a symmetric transformation can be used to form a merged PiN Schottky (MPS) diode in the present invention. For instance, the cross-networking arrangement after symmetric transformation of the second linear arrangement can be obtained in FIG. 25. In addition to the symmetric transformation of the linear arrangement, based on different designs shown in FIGS. 8 to 26, more layout designs with new cross-networking arrangement can be obtained through different combinations as shown in FIGS. 26 to 33. For example, FIG. 29 is the layout design of a merged PiN Schottky (MPS) diode with cross-networking arrangement combining FIGS. 11 and 25; while FIG. 32 is the layout design of a merged PiN Schottky (MPS) diode with cross-networking arrangement combining FIGS. 23 and 29.

Figure 34:
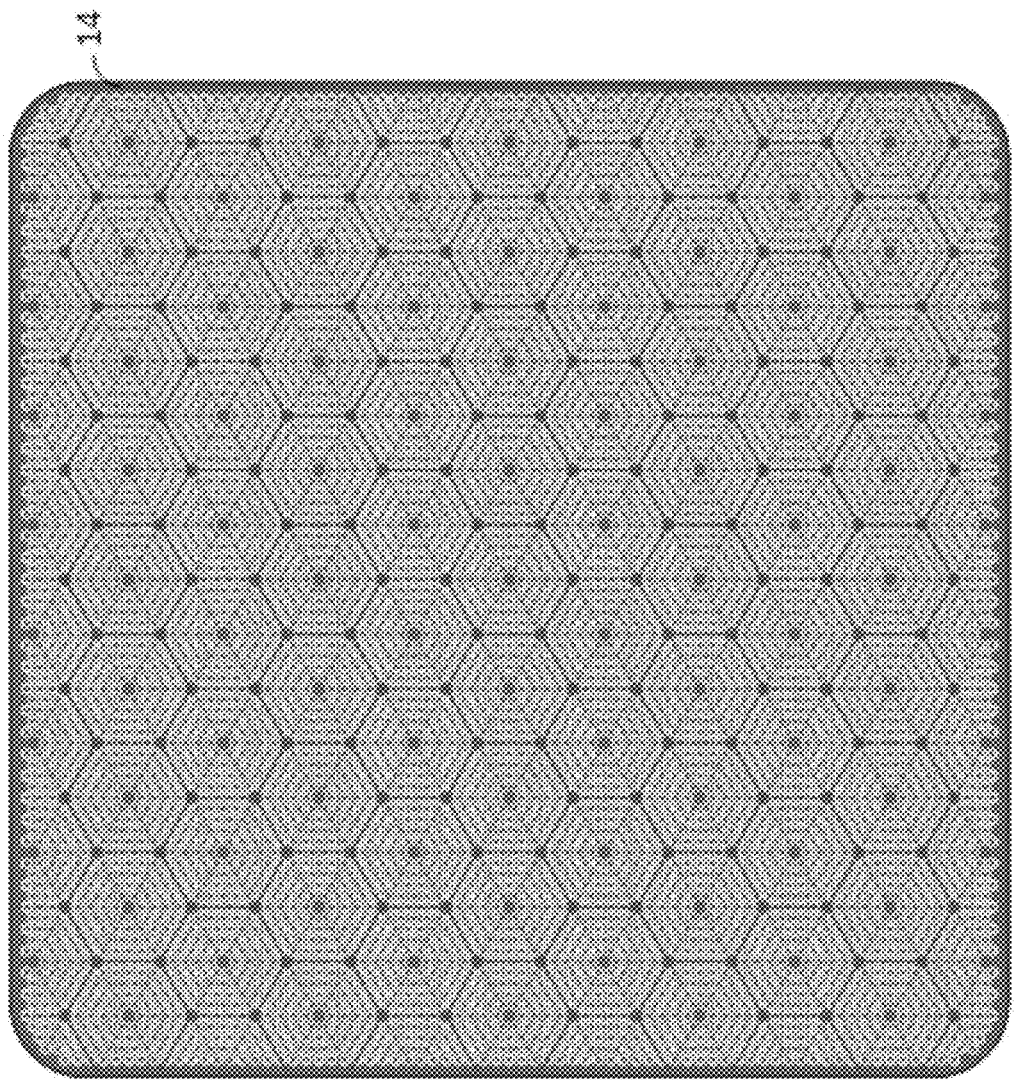
FIG. 34 is a schematic view of a merged PiN Schottky (MPS) diode with a close-packed plasma spreading layer.
Figure 35A:
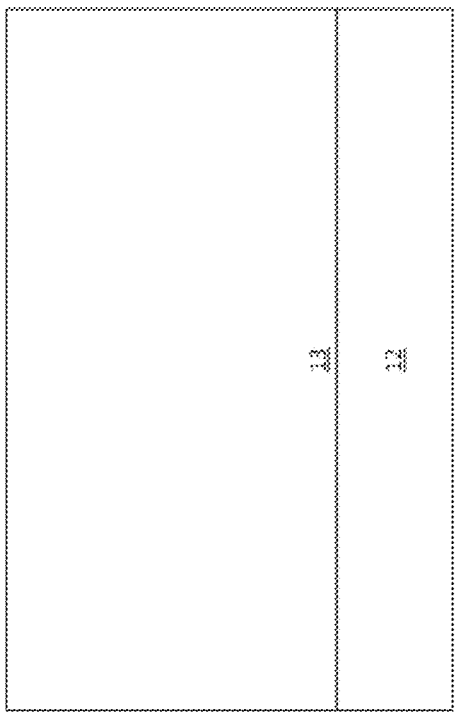
FIGS. 35A to 35G illustrate flow diagrams of the method for manufacturing a merged PiN Schottky (MPS) diode in the present invention.
Figure 35B:
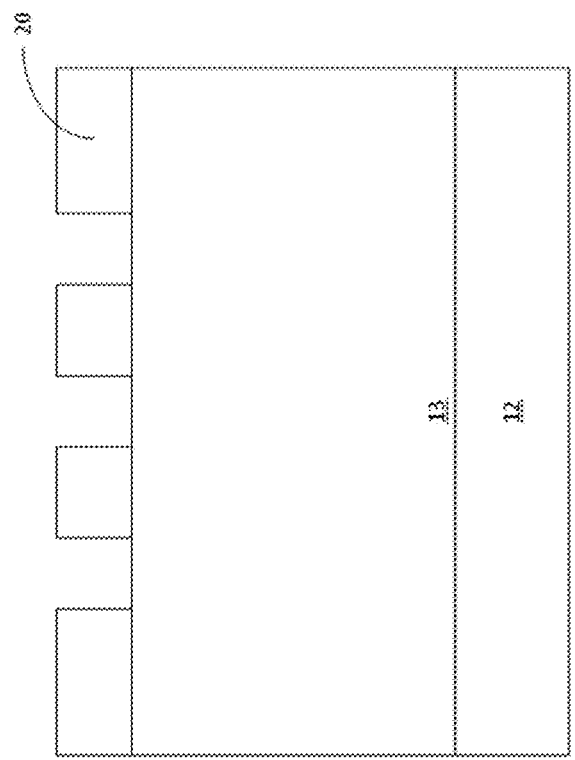
Figure 35C:
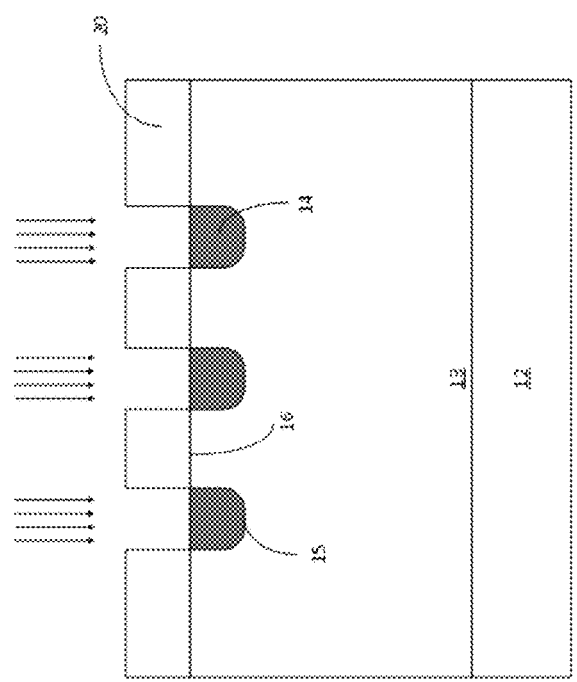
Figure 35D:
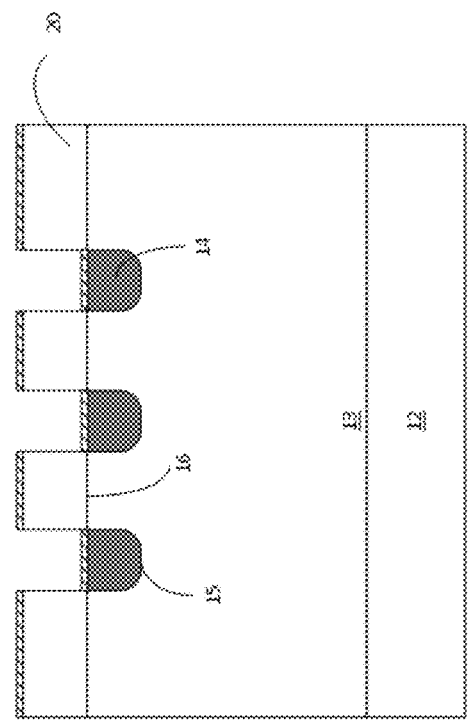
Figure 35E:
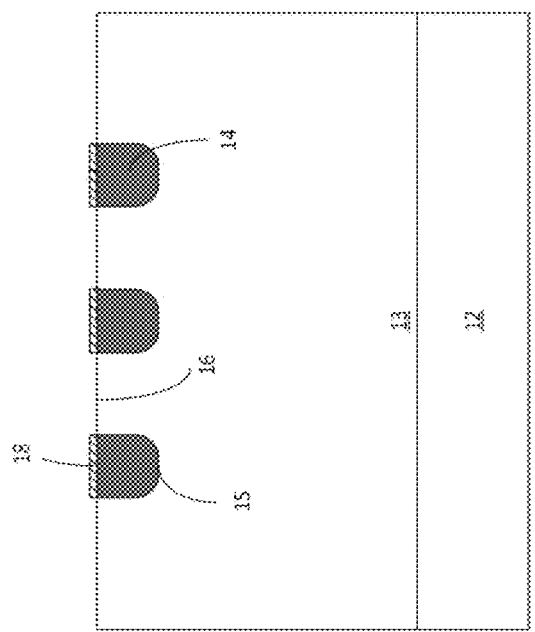
Figure 35F:
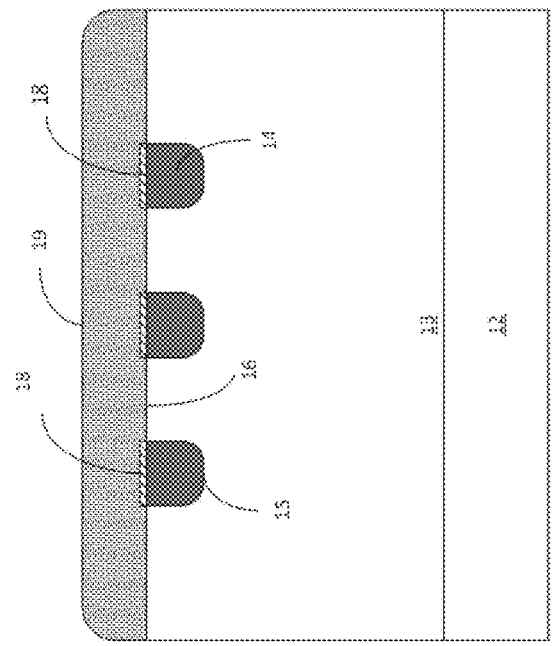
Figure 35G:
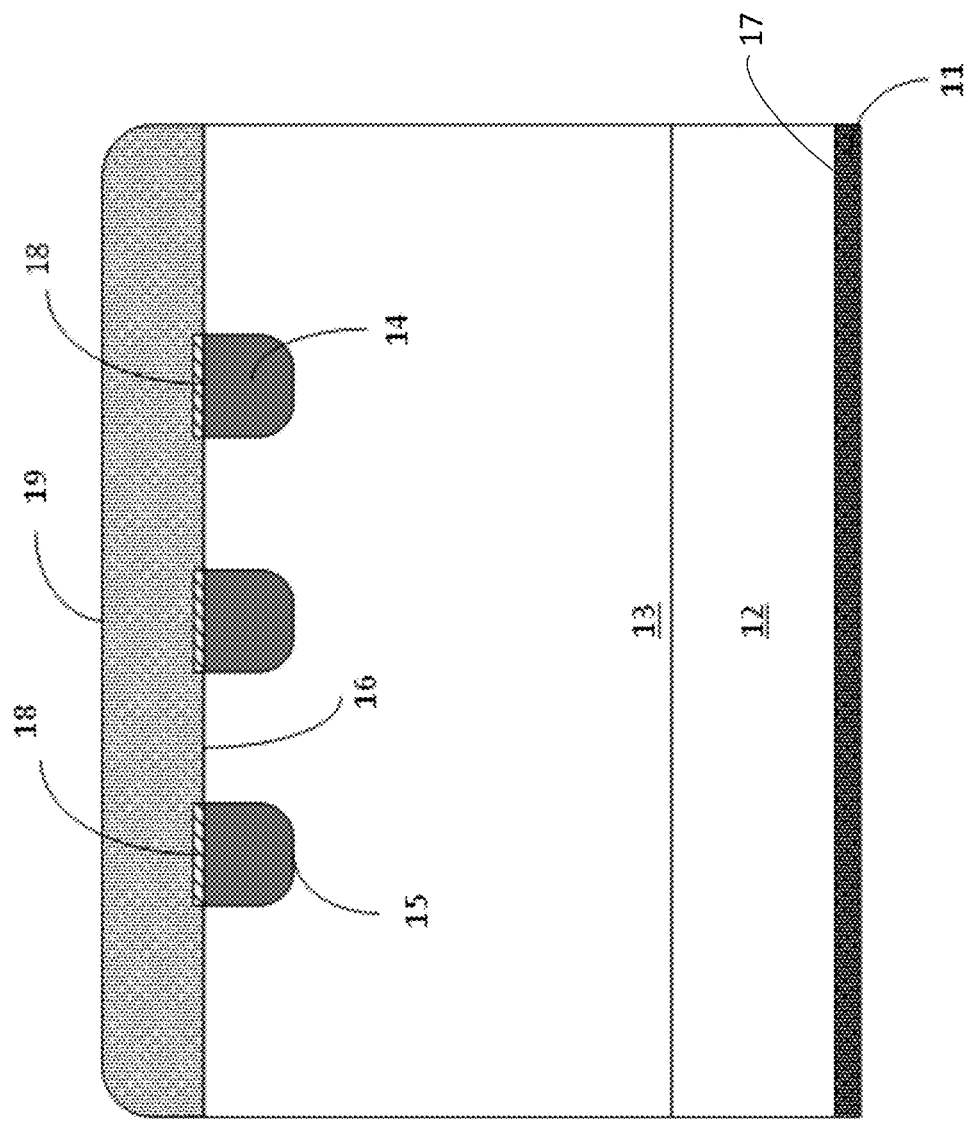
Figure 36:
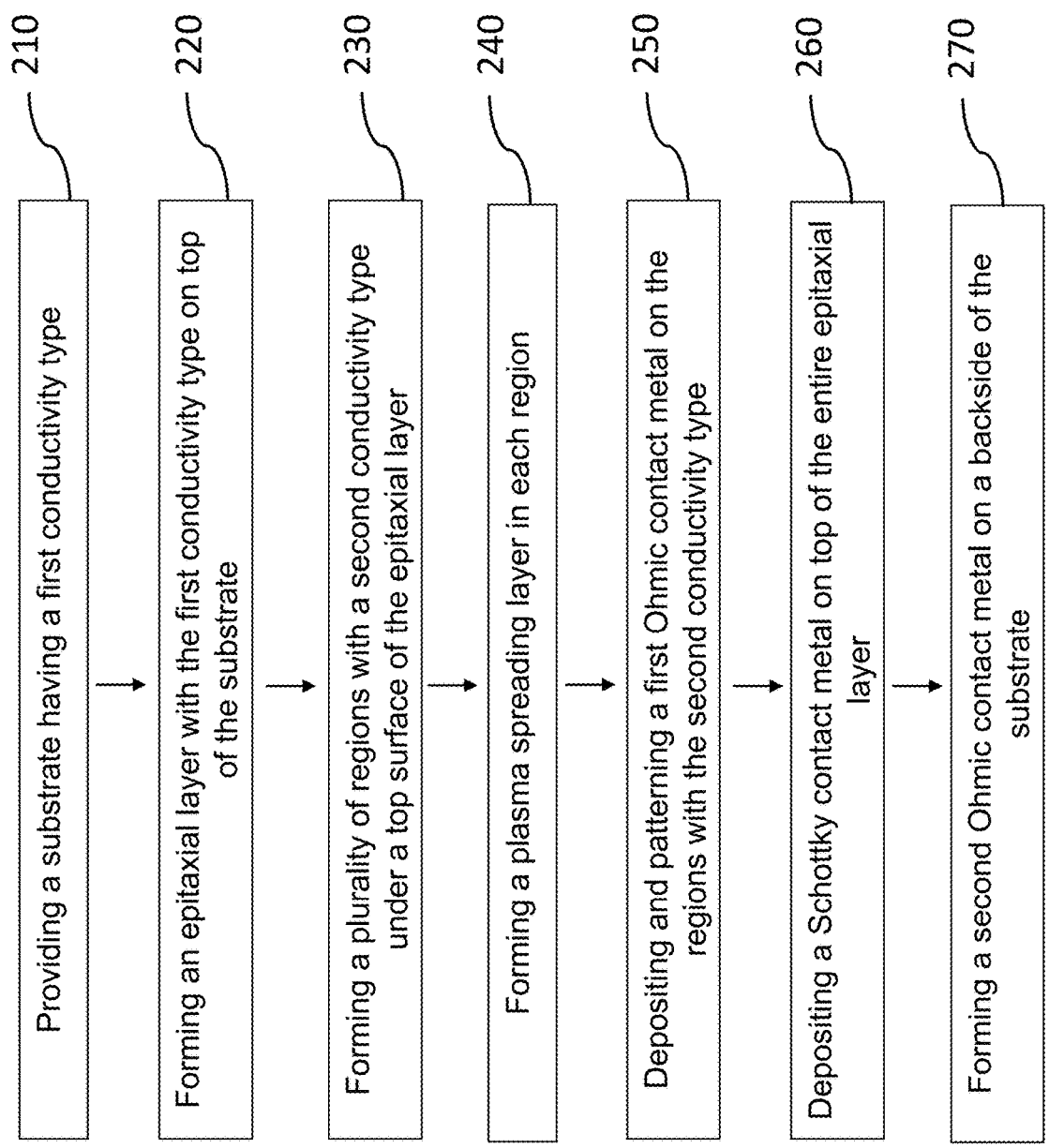
FIG. 36 is a block diagram illustrating the method for manufacturing a merged PiN Schottky (MPS) diode in the present invention.

Meanwhile, the fourth type hexagonal unit can also form a layout design of a merged PiN Schottky (MPS) diode through a close-packed arrangement as shown in FIG. 34. It is important to note that the design of the plasma spreading layers in the present invention are also applicable to other hexagonal cells designs that may not be shown here. Moreover, the design of the plasma spreading layers in the present invention can also be applied to different geometric cells, such as circular cells, regular octagonal cells and other polygonal cells.

In another aspect, as shown in FIGS. 35A to 35G, and 36, a method for manufacturing a merged PiN Schottky (MPS) diode may include steps of providing a substrate having a first conductivity type 210; forming an epitaxial layer with the first conductivity type 220 on top of the substrate; forming a plurality of regions with a second conductivity type under a top surface of the epitaxial layer 230; forming a plasma spreading layer in each region 240; depositing and patterning an Ohmic contact metal on the regions with the second conductivity type 250; depositing a Schottky contact metal on top of the entire epitaxial layer 260; and forming an Ohmic contact metal on a backside of the substrate 270.

In one embodiment, the epitaxial layer is made of N-type silicon carbide. In another embodiment, the step of forming a plurality of regions with a second conductivity type under a top surface of the epitaxial layer 230 may include steps of depositing and patterning a mask layer 20 on the epitaxial layer 2301, implanting P-type dopant into the epitaxial layer 2302, and removing the mask layer 2303. It is noted that the dopant can be aluminum or boron.

In a further embodiment, the step of depositing and patterning an Ohmic contact metal on the regions 240 may include a step of annealing the Ohmic metal to enable the metal to be in direct contact with the epitaxial layer. In still a further embodiment, the step of depositing a Schottky contact metal on top of the entire epitaxial layer 250 may include a step of conducting a low temperature annealing of the Schottky contact metal.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A semiconductor device comprising:
   a substrate having a first conductivity type;
   an epitaxial layer having the first conductivity type deposited on one side of the substrate;
   a plurality of regions having a second conductivity type formed under a top surface of the epitaxial layer;
   a first Ohmic metal patterned and deposited on top of the regions with the second conductivity type;
   a Schottky contact metal deposited on top of the entire epitaxial layer to form a Schottky junction; and
   a second Ohmic metal deposited on a backside of the substrate,
   wherein a plasma spreading layer is formed in each of the regions, and the plasma spreading layer is configured to diffuse plasma when a surge current occurs, so the surge current and heat generated inside the semiconductor device is configured to be dispersed over the semiconductor device,
   wherein the first conductivity type is N-type and the second conductivity type is P-type; and each of the regions is a P+ region; and each P+ region has a plurality of hexagonal cells with one or more P+ rings and a plasma spreading layer that has a plurality of triangular-based plasma spreading structures passing through the hexagonal cells and P+ rings.

2. The semiconductor device of claim 1, wherein the semiconductor device is a merged PiN Schottky (MPS) diode.

3. The semiconductor device of claim 1, wherein a PN junction formed between each of the P+ regions and N-type drift regions is turned on when the surge current occurs, and plasmas are generated under the PN junction.

4. The semiconductor device of claim 1, wherein each P+ region has a plurality of hexagonal cells with one or more P+ rings and a plasma spreading layer that has a plurality of hexagonal-based plasma spreading structures passing through the hexagonal cells and P+ rings.

* * * * *